(12) United States Patent  
Sasago et al.

(10) Patent No.: US 9,099,177 B2
(45) Date of Patent: Aug. 4, 2015

(54) SEMICONDUCTOR STORAGE DEVICE

(75) Inventors: Yoshitaka Sasago, Tokyo (JP); Masaharu Kinoshita, Tokyo (JP); Akira Kotabe, Tokyo (JP); Takashi Kobayashi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 45 days.

(21) Appl. No.: 14/124,725

(22) PCT Filed: Jun. 10, 2011

(86) PCT No.: PCT/JP2011/003285
§ 371 (c)(1),
(2), (4) Date: Apr. 16, 2014

(87) PCT Pub. No.: WO2012/168981
PCT Pub. Date: Dec. 13, 2012

(65) Prior Publication Data
US 2014/0218999 A1    Aug. 7, 2014

(51) Int. Cl.
*G11C 5/02*    (2006.01)
*G11C 13/00*   (2006.01)
*H01L 27/24*   (2006.01)
*H01L 45/00*   (2006.01)

(52) U.S. Cl.
CPC ........ *G11C 13/0004* (2013.01); *G11C 13/0026* (2013.01); *G11C 13/0028* (2013.01); *H01L 27/2454* (2013.01); *H01L 27/2481* (2013.01); *G11C 2213/71* (2013.01); *G11C 2213/75* (2013.01); *H01L 45/06* (2013.01); *H01L 45/1233* (2013.01); *H01L 45/144* (2013.01)

(58) Field of Classification Search
CPC ....... G11C 5/063; G11C 7/18; G11C 11/4097
USPC ..................................... 365/63, 51
See application file for complete search history.

(56) References Cited

U.S. PATENT DOCUMENTS

| 6,990,004 B2 * | 1/2006 | Iwata ............................... 365/63 |
| 7,414,295 B2 * | 8/2008 | Cho et al. ...................... 257/529 |
| 7,471,545 B2 * | 12/2008 | Nii .................................. 365/154 |
| 7,539,056 B2 | 5/2009 | Katsumata et al. |
| 8,169,819 B2 | 5/2012 | Shima et al. |
| 2008/0149913 A1 | 6/2008 | Tanaka et al. |
| 2012/0248399 A1 | 10/2012 | Sasago et al. |

FOREIGN PATENT DOCUMENTS

| JP | 2008-160004 A | 7/2008 |
| JP | 2008-192708 A | 8/2008 |
| JP | 2010-165982 A | 7/2010 |
| WO | WO 2012/070096 A1 | 5/2012 |

* cited by examiner

Primary Examiner — Son Dinh
(74) Attorney, Agent, or Firm — Miles & Stockbridge P.C.

(57) ABSTRACT

With the aim of providing a semiconductor memory device being suitable for miniaturization and allowing a contact resistance to lower, the wiring structure of a memory array (MA) is formed as follows. That is, word lines (2) and bit lines (3) are extended in parallel to each other, each of the word lines is bundled with another word line, each of the bit lines is bundled with another bit line, and two bit lines formed vertically over respective bundled two word lines are separated electrically. Such a configuration makes it possible to: form a larger contact at a bundling section (MLC) of wires; and lower a contact resistance in the memory array suitable for miniaturization.

15 Claims, 22 Drawing Sheets

F I G . 1
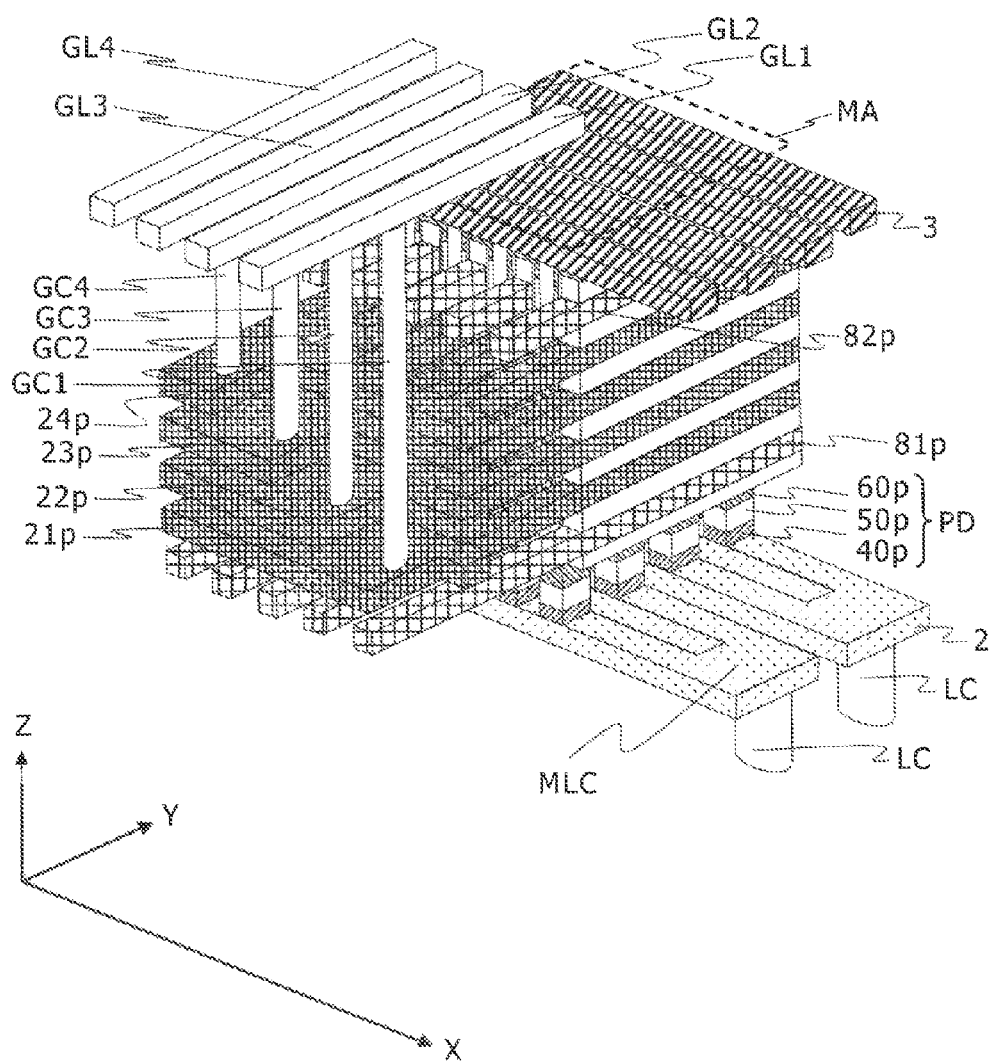

RESET/SET/READOUT OPERATION

RESET/SET/READOUT OPERATION

FIG. 13

| | DEVICE CONFIGURATION | | | VOLTAGE CONDITION FOR SELECTIVE OPERATION | | | |
|---|---|---|---|---|---|---|---|
| | BUNDLING OF UPPER WIRES | BUNDLING OF LOWER WIRES | DIODE | UPPER ELECTRODE WIRE | | LOWER ELECTRODE WIRE | |
| | | | | SELECTIVE | NON-SELECTIVE | SELECTIVE | NON-SELECTIVE |
| (1) | CONSECUTIVE TWO WIRES | CONSECUTIVE TWO WIRES | PRESENT | LOW | WIRE OPPOSITE TO SELECTIVE LOWER ELECTRODE WIRE IS HIGH, THE OTHER WIRES MAY BE EITHER HIGH OR LOW | HIGH | LOW |
| (2) | ALTERNATELY | CONSECUTIVE TWO WIRES | PRESENT | LOW | HIGH | HIGH | LOW |
| (3) | EVERY THIRD WIRES | CONSECUTIVE THREE WIRES | PRESENT | LOW | HIGH | HIGH | LOW |

RESET/SET/READOUT OPERATION

SEMICONDUCTOR STORAGE DEVICE

BACKGROUND

The present invention relates to a semiconductor memory device.

In recent years, a phase-change memory using a chalcogenide material as a recording material is actively studied. A phase-change memory is a type of a resistance-change memory to store information by using a recording material having different resistance states between electrodes.

A phase-change memory stores information by using the fact that the resistance value of a phase-change material such as $Ge_2Sb_2Te_5$ varies between an amorphous state and a crystal state. Resistance is high in an amorphous state and low in a crystal state. Consequently, readout is carried out by giving a potential difference to both the terminals of an element, measuring an electric current flowing in the element, and judging whether the element is in a high resistance state or in a low resistance state.

In a phase-change memory, data are rewritten by changing the electric resistance of a phase-change film into a different state by Joule heat generated by electric current. Reset operation, namely operation of changing the phase-change film into an amorphous state of a high resistance, is carried out by dissolving a phase-change material by flowing a large current for a short period of time and thereafter rapidly cooling the phase-change material by rapidly reducing the electric current. Meanwhile, set operation, namely operation of changing the phase-change film into a crystal state of a low resistance, is carried out by flowing an electric current enough to retain a phase-change material at a crystallization temperature for a long period of time. Such a phase-change memory can reduce an electric current required for changing the state of a phase-change film as miniaturization advances and hence is suitable for miniaturization in principle. For the reason, such a phase-change memory is actively studied.

As a method for highly integrating a memory using such a resistance-change element, a configuration of: forming a plurality of through-holes penetrating all layers in a laminated structure formed by stacking a plurality of gate electrode materials and a plurality of insulation films alternately through a batch process; and forming and processing a gate insulation film, a channel layer, and a phase-change film inside each of the through-holes is disclosed in Japanese unexamined Patent Application Publication No. 2008-160004.

Meanwhile, although it is a document not on a phase-change memory but on an NAND flash memory, a technology of reducing the resistance of a bit line and improving performance by implanting ions with a mask so that a selective transistor may be an enhancement type or a depression type and bundling metal wires is disclosed in Japanese Unexamined Patent Application Publication No. 2008-192708.

SUMMARY

A phase-change memory described in Japanese Unexamined Patent Application Publication No. 2008-160004 however has the following problem. The problem is that upper and lower electrode wires are processed into a stripe shape at a pitch identical to the pitch of memory cells, hence the widths of the electrode wires are narrow, the size of a contact coupling the electrode wires to peripheral circuits is limited to a size comparable to the wire widths, and a contact resistance increases. As a result, when a memory cell is operated by flowing electric current, voltage drops at a contact section and a voltage required for operation increases undesirably. As a result, the peripheral circuits increase and the reliability of the memory cell deteriorates. The problem is significant in particular when a memory cell is miniaturized and a wire width narrows and when many layers are stacked and the depth of a contact hole increases. The miniaturization and multilamination of a memory cell are essential for the increase of a capacity.

Japanese Unexamined Patent Application Publication No. 2008-192708 discloses a method of implanting ions with a mask so that an adjacent selective transistor may be an enhancement type or a depression type and bundling metal wires. The ions implanted the ion implantation diffuse however and hence it comes to be difficult to manufacture adjacent selective transistors of an enhancement type and a depression type separately when the miniaturization advances.

In view of the above situation, an object of the present invention is to reduce a contact resistance in a memory cell array more suitable for miniaturization.

The above and further objects and novel features of the present invention will appear from the description and the accompanying drawings in the specification.

Representative outlines of the invention disclosed in the present application are briefly explained as follows.

Firstly, the present invention is a semiconductor memory device characterized in that: the semiconductor memory device has a plurality of word lines extending in an X direction parallel to a principal plane of a semiconductor substrate, a plurality of diode layers formed over the word lines, a plurality of laminated bodies being formed cyclically in the X direction and respectively having first gate semiconductor layers formed over the diode layers in the manner of extending in a Y direction intersecting the X direction and being parallel to the principal plane of the semiconductor substrate, a plurality of second gate semiconductor layers formed over the first gate semiconductor layers in the manner of extending in the Y direction and being laminated to each other through insulation layers, and third gate semiconductor layers formed over the second gate semiconductor layers in the manner of extending in the Y direction, a plurality of first channel layers formed between the first gate semiconductor layers through insulation layers and coupled electrically to the diode layers, a plurality of first gate insulation film layers formed on a +X side and a −X side of the sides of the second gate semiconductor layers and the third gate semiconductor layers, a plurality of second channel layers formed cyclically in the Y direction on the +X side of the sides of the second gate semiconductor layers and the third gate semiconductor layers through the first gate insulation film layers and coupled electrically to the first channel layers, a plurality of first resistance change material layers being formed cyclically in the Y direction on the +X side of the sides of the second gate semiconductor layers through the first gate insulation film layers and the second channel layers, being coupled electrically to the first channel layers, and comprising a material the resistance value of which varies in response to a flowing electric current, a plurality of third channel layers formed cyclically in the Y direction on the −X side of the sides of the second gate semiconductor layers and the third gate semiconductor layers through the first gate insulation film layers and coupled electrically to the first channel layers, a plurality of second resistance change material layers being formed cyclically in the Y direction on the −X side of the sides of the second gate semiconductor layers through the first gate semiconductor layers and the third channel layers, being coupled electrically to the first channel layers, and comprising a material the resistance value of which varies in response to a flowing electric current, and a plurality of bit lines formed vertically over the respective word lines on the basis of the principal plane of the semiconductor substrate in the manner of extending in the X direction and coupled electrically to the second channels and the third channels; the respective word lines are bundled with other word lines; the respective bit lines are bundled with other bit lines; and two of the bit lines formed vertically over respective bundled two word lines in the word lines are separated electrically.

Secondly, the present invention is a semiconductor memory device characterized in that: the semiconductor memory device has a plurality of word lines extending in an X direction parallel to a principal plane of a semiconductor substrate, a plurality of laminated bodies being formed cyclically in the X direction and respectively having first gate semiconductor layers formed over the word lines in the manner of extending in a Y direction intersecting the X direction and being parallel to the principal plane of the semiconductor substrate, a plurality of second gate semiconductor layers formed over the first gate semiconductor layers in the manner of extending in the Y direction and being laminated to each other through insulation layers, and third gate semiconductor layers formed over the second gate semiconductor layers in the manner of extending in the Y direction, a plurality of first channel layers formed between the first gate semiconductor layers through insulation layers and coupled electrically to the word lines, a plurality of first gate insulation film layers formed on a +X side and a −X side of the sides of the second gate semiconductor layers and the third gate semiconductor layers, a plurality of second channel layers formed cyclically in the Y direction on the +X side of the sides of the second gate semiconductor layers and the third gate semiconductor layers through the first gate insulation film layers and coupled electrically to the first channel layers, first resistance change material layers being formed cyclically in the Y direction on the +X side of the sides of the second gate semiconductor layers through the first gate semiconductor layers and the second channel layers, being coupled electrically to the first channel layers, and comprising a material the resistance value of which varies in response to a flowing electric current, a plurality of third channel layers formed cyclically in the Y direction on the −X side of the sides of the second gate semiconductor layers and the third gate semiconductor layers through the first gate insulation film layers and coupled electrically to the first channel layers, second resistance change material layers being formed cyclically in the Y direction on the −X side of the sides of the second gate semiconductor layers through the first gate semiconductor layers and the third channel layers, being coupled electrically to the first channel layers, and comprising a material the resistance value of which varies in response to a flowing electric current, and a plurality of bit lines formed vertically over the respective word lines on the basis of the principal plane of the semiconductor substrate in the manner of extending in the X direction and coupled electrically to the second channels and the third channels; respective adjacent two word lines of the word lines are bundled together respective adjacent two bit lines of the bit lines are bundled together; and two of the bit lines formed vertically over respective bundled two word lines in the word lines are separated electrically.

Thirdly, the present invention is a semiconductor memory device characterized by having: a first plate formed over a semiconductor substrate; a second plate formed over the first plate; a plurality of laminated bodies being formed cyclically in an X direction intersecting a Y direction and being parallel to a principal plane of the semiconductor substrate and respectively having first gate semiconductor layers formed over the first plate in the manner of extending in the Y direction parallel to the principal plane of the semiconductor substrate, a plurality of second gate semiconductor layers formed over the first gate semiconductor layers in the manner of extending in the Y direction and being laminated to each other through insulation layers, and third gate semiconductor layers formed over the second gate semiconductor layers in the manner of extending in the Y direction; a plurality of first channel layers formed between the first gate semiconductor layers through insulation layers; a plurality of first gate insulation film layers formed on a +X side and a −X side of the sides of the second gate semiconductor layers and the third gate semiconductor layers; a plurality of second channel layers formed cyclically in the Y direction on the +X side of the sides of the second gate semiconductor layers and the third gate semiconductor layers through the first gate insulation film layers and coupled electrically to the first channel layers and the second plate; first resistance change material layers being formed cyclically in the Y direction on the +X side of the sides of the second gate semiconductor layers through the first gate semiconductor layers and the second channel layers, being coupled electrically to the first channel layers, and comprising a material the resistance value of which varies in response to a flowing electric current; a plurality of third channel layers formed cyclically in the Y direction on the −X side of the sides of the second gate semiconductor layers and the third gate semiconductor layers through the first gate insulation film layers and coupled electrically to the first channel layers and the second plate; second resistance change material layers being formed cyclically in the Y direction on the −X side of the sides of the second gate semiconductor layers through the first gate semiconductor layers and the third channel layers, being coupled electrically to the first channel layers, and comprising a material the resistance value of which varies in response to a flowing electric current; first transistor layers being formed between the first plate and the first gate semiconductor layers and selecting two first channels adjacent to each other in the Y direction from the first channels; and second transistor layers being formed between the first transistor layers and the first gate semiconductor layers and selecting two first channels adjacent to each other in the Y direction from the first channels.

The present invention makes it possible to reduce a contact resistance in a memory cell array more suitable for miniaturization.

BRIEF DESCRIPTION OF THE DRAWINGS

FIG. 1 is a partial schematic stereograph of a memory cell array according to a first embodiment of the present invention;

FIG. 13 is a table collectively explaining voltage applied to upper electrode wires and lower electrode wires in a memory cell array according to the first embodiment of the present invention;

DETAILED DESCRIPTION

Embodiments according to the present invention are hereunder explained in detail in reference to drawings. Here, in all the drawings for explaining the embodiments, members having an identical function are represented with an identical code and are not explained repeatedly. Further, it may be stated in advance that a section explained on a characteristic configuration is not limited to each of the embodiments and similar effects can be obtained when a common configuration is adopted.

First Embodiment

Memory Array Configuration

FIG. 1 is a partial schematic stereograph of a semiconductor memory device according to a first embodiment of the present invention and parts of a memory cell array, wires, and contacts are shown. Shown in FIG. 1 is a part comprising word lines 2, contact holes LC to couple the word lines 2 to peripheral circuits, diode layers PD each of which comprises a polysilicon layer 40$p$ into which p-type impurities are doped, a polysilicon layer 50$p$ into which low-concentration impurities are doped, and a polysilicon layer 60$p$ into which n-type impurities are doped, gate polysilicon layers 21$p$, 22$p$, 23$p$, and 24$p$ of a memory cell, gate polysilicon layers 81$p$ and 82$p$ of selective transistors, metal wires GL1, GL2, GL3, and GL4 for feeding electricity to the gate polysilicon layers of the Memory cell, contacts GC1, GC2, GC3, and GC4 to couple the gate polysilicon layers 21$p$, 22$p$, 23$p$, and 24$p$ of the memory cell to the wires GL1, GL2, GL3, and GL4 respectively, and bit lines 3.

With regard to the word lines 2, adjacent two word lines are bundled (electrically short-circuited) outside the memory array and a contact hole LC is formed at a bundling section MLC thereof and coupled to peripheral circuits. An LC is formed at a bundling section MLC of wires and hence can be formed larger than an individual wire width. Consequently, the resistance of a contact LC is low in comparison with the case of forming a contact within the width of one wire.

Figure 2:
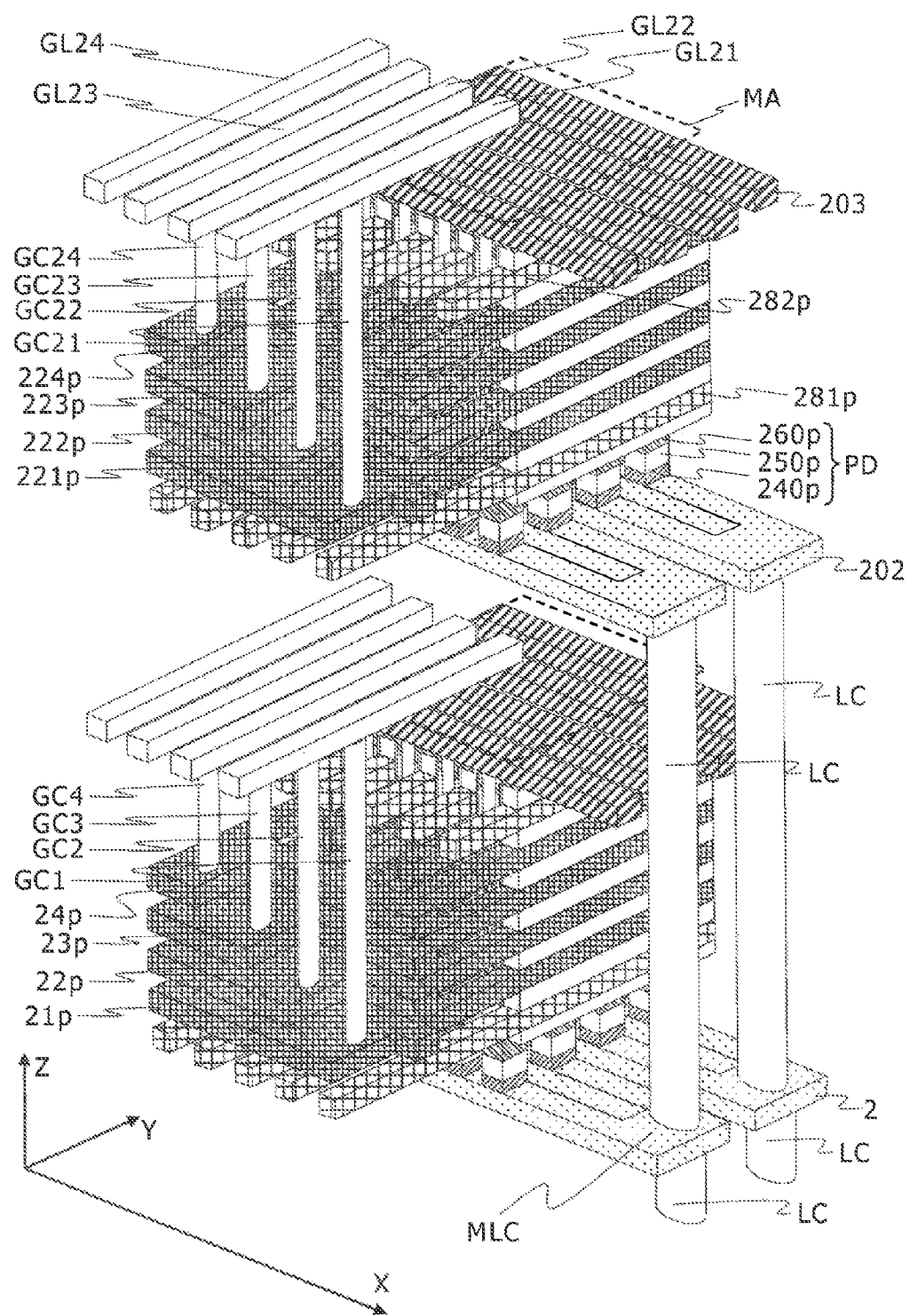
FIG. 2 is a partial schematic stereograph of a memory cell array according to the first embodiment of the present invention.

Although it is not shown in the figure, with regard to the bit lines 3 too, adjacent two bit lines are bundled on the other side of an MA outside the memory array and a contact hole LC is formed at a bundling section MLC thereof and coupled to peripheral circuits. The resistance is low in comparison with the case of forming a contact within the width of one wire in the same manner as a contact LC formed at word lines 2. FIG. 2 is a schematic stereograph in the case of promoting capacity increase by stacking MAs of FIG. 1. The structure is formed by stacking structures similar to FIG. 1 and bundling word lines 2 and 202. Although they are not shown in the figure, bit lines 3 and 203 are also bundled on the other side of the MAs. As it will be described later, to reduce the resistances of contacts LC to the word lines 2 and 202 and the bit lines 3 and 203 is beneficial particularly in the case of stacking memory arrays MA and promoting capacity increase like FIG. 2. When the stack of memory arrays MA advances, the location of metal wires comes to be separated upward from a semiconductor substrate over which peripheral circuits are formed and the resistances of contacts coupling the peripheral circuits to the metal wires of the MAs increase. It is possible to inhibit a contact resistance from increasing by using a large contact like an LC of FIG. 2.

A method of bundling the word lines 2 and the bit lines 3 is explained here. Each of the word lines 2 is bundled with another word line 2. By such a configuration, as shown in FIG. 2, it is possible to form a contact between memory arrays at a bundling section of the word lines 2 and inhibit the resistance of the contact between the memory arrays from increasing in a configuration of stacking the memory arrays. Although they are omitted in FIG. 2 for simplification, with regard to the bit lines 3, a bit line 3 is bundled with another bit line 3 likewise.

On the occasion, word lines 2 and bit lines 3 must not be bundled in an identical pattern. That is, a characteristic is that, in the bundling pattern of wires shown in FIG. 1, two bit lines 3 respectively formed vertically over (in a +Z direction when a Z axis is set vertically to a principal plane of a semiconductor substrate) bundled two word wires of the word wires are separated electrically. The purpose of having such a characteristic is to materialize selective operation in a Y direction by combining with selective transistors that will be described later (details of selective operation are described later).

The above explanations are summarized as follows. The word lines 2 and the bit lines 3 according to the present embodiment are characterized in that (1) each of the word lines is bundled with another word line, (2) each of the bit lines is bundled with another bit line, and (3) two bit lines respectively formed vertically over bundled two word lines are separated electrically. By being characterized in this way, it is possible to: form a contact at each of the bundling sections of the word lines and the bit lines; and reduce a contact resistance.

Figure 3:
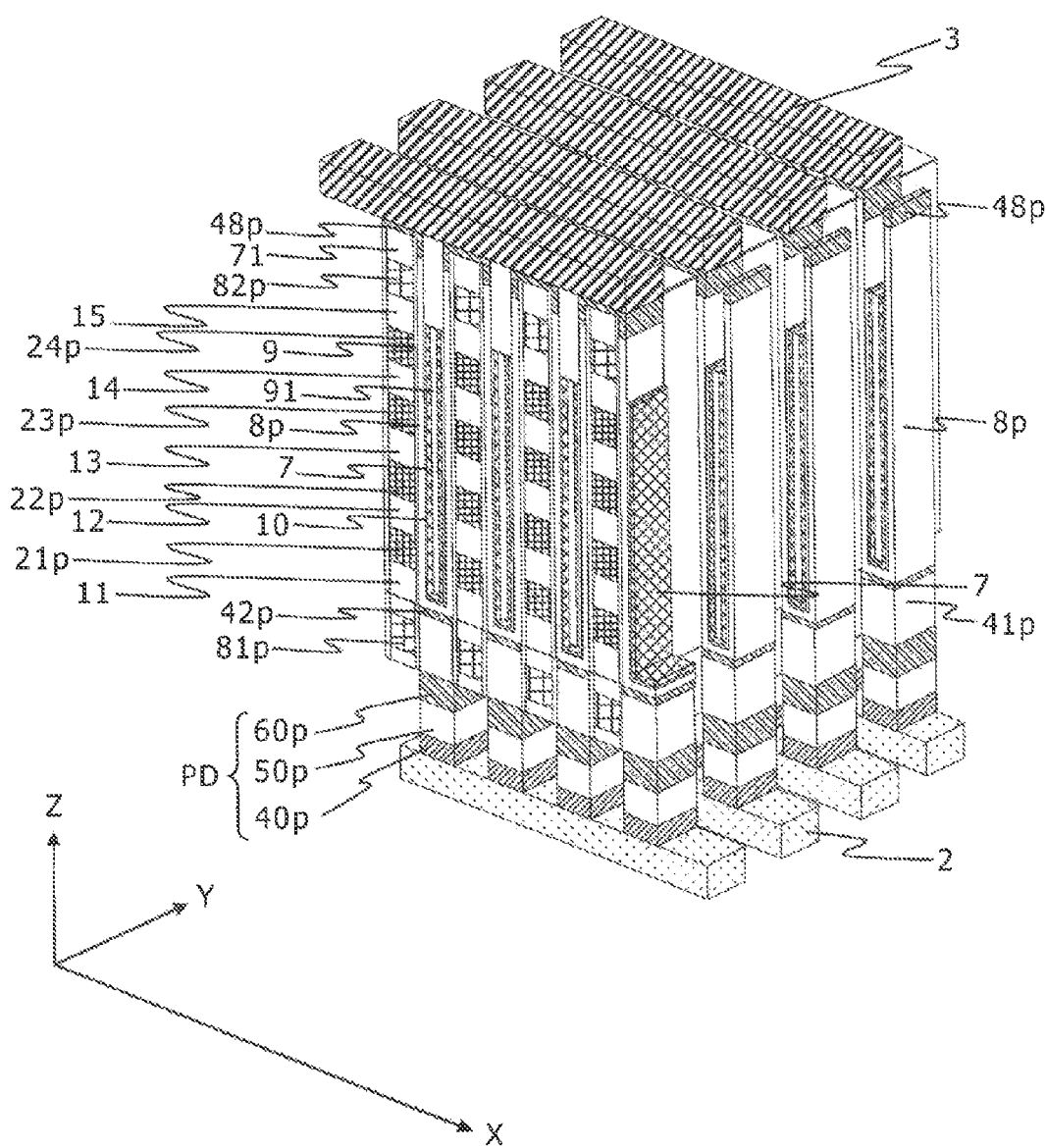
FIG. 3 is a partial schematic stereograph of a memory cell array according to the first embodiment of the present invention.
Figure 15:
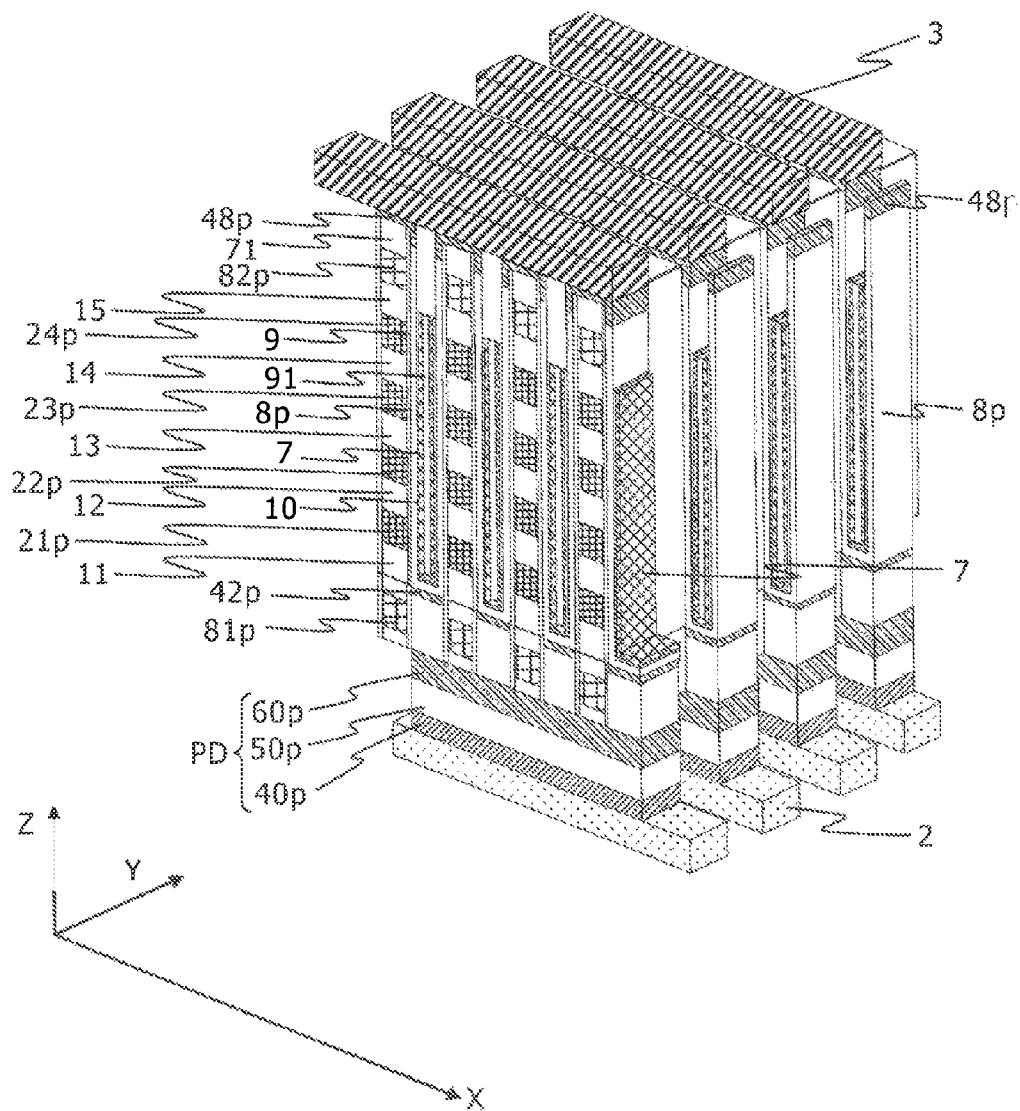
FIG. 15 is a partial schematic stereograph of a modification, of a memory cell array according to the first embodiment of the present invention.

FIG. 3 is a view particularly showing the section of the memory array extracted from FIG. 1. Diode layers PD comprising polysilicon are formed over a plurality of word lines 2 extending in an X direction. Here, the diode layers PD are formed cyclically through insulation films (not shown in the figure) in the X direction but it is also possible to configure the diode layers PD so as to extend in the X direction as shown in FIG. 15. Laminated films each of which comprises gate polysilicon layers 81$p$, 21$p$, 22$p$, 23$p$, 24$p$, and 82$p$ and insulation film layers 11, 12, 13, 14, 15, and 71 are patterned so as to form a stripe shape in a Y direction perpendicular to the direction in which the word lines 2 extend.

Bit lines 3 have a stripe shape extending in the X direction parallel to the word lines 2 and are formed over the insulation films 71 through n-type polysilicon layers 48$p$.

In each of space sections of the laminated films comprising the gate polysilicon layers 81$p$, 21$p$, 22$p$, 23$p$, 24$p$, and 82$p$ and the insulation film layers 11, 12, 13, 14, 15, and 71 under the bit lines 3, a gate insulation film 9, a channel polysilicon layer 8$p$, an insulation film layer 10, and a phase-change material layer 7 are stacked in sequence over the sidewalls of the gate polysilicon layers 21$p$, 22$p$, 23$p$, and 24$p$, the sidewalls of the insulation film layers 11, 12, 13, and 14, and the lower parts of the sidewalls of the insulation films 15. The insulation film layer 10 is a layer for preventing diffusion between the phase-change material layer 7 and the channel polysilicon layer 8$p$. An insulation film layer 91 is embedded between both the faces of the phase-change material layer 7. The gate insulation film layer 9 and the channel polysilicon layer 8$p$ are stacked over the upper parts of the sidewalls of the insulation film layers 15 and the sidewalls of the gate polysilicon layers 82$p$ and the insulation film layers 71. An insulation film layer 92 is embedded between both the faces of the channel polysilicon layer 8$p$. At the bottom of each of the space sections of the laminated films comprising the gate polysilicon layers 21$p$, 22$p$, 23$p$, 24$p$, and 82$p$ and the insulation film layers 11, 12, 13, 14, 15, and 71 under the bit lines 3, the top face of a polysilicon layer 42$p$ touches the channel polysilicon layer 8$p$. The polysilicon layer 42$p$ connects further with a wire 2 through a polysilicon layer 41$p$.

In this way, a memory array (MA) in FIG. 3 has the configuration of forming cyclically in the X direction laminated bodies each of which has a first gate semiconductor layer (81$p$) formed over a diode layer (PD) in the manner of extending in the Y direction, a plurality of second gate semiconductor layers (21$p$ to 24$p$) stacked over each other through insulation films (11 to 15) formed over the first gate semiconductor layer in the manner of extending in the Y direction, and a third gate semiconductor layer (82$p$) formed over the second gate semiconductor layers in the manner of extending in the Y direction.

Then the memory array has first channel layers (41$p$) formed between the first gate semiconductor layers through insulation bodies and coupled electrically to the diode layers PD; a plurality of first gate insulation film layers (9) formed on a +X side and a −X side of the sides of the second gate semiconductor layers and the third gate semiconductor layers; a plurality of second channel layers (8$p$+X) formed cyclically in the Y direction on the +X side of the sides of the second gate semiconductor layers and the third gate semiconductor layers through the first gate semiconductor layers and coupled electrically to the first channel layers; a plurality of third channel layers (8$p$−X) formed on the −X side likewise; a plurality of first resistance change material layers being formed cyclically in the Y direction on the +X side of the sides of the second gate semiconductor layers through the first gate insulation film layers and the second channel layers and comprising a material the resistance value of which varies in response to a flowing electric current; and a plurality of second resistance change material layers formed on the −X side likewise. Here, the first gate semiconductor layers and the first channel layers constitute first X selective transistor layers to carry out selection in the X direction. The third gate semiconductor layers, the second channels, and the third channels constitute second X selective transistor layers likewise. The combination of the second gate semiconductor layers, the second channels, and the first resistance change material layers and the combination of the second gate semiconductor layers, the third channels, and the second resistance change material layers constitute memory cells (SMC and USMC) respectively.

Such a configuration makes it possible to: form two memory cells on a +X side and a −X side in the cycle of 2F in the X direction when a minimum processing size is defined as F; and further contribute to the miniaturization of a memory cell. Further, selective operations in the X, Y, and Z directions are required respectively in order for a three-dimensional memory array MA to function as a memory element and the memory array configuration stated above makes the selective operations possible. The reason will be described later.

A semiconductor memory device according to the present invention stores information by using the fact that the resistance value of a phase-change material such as $Ge_2Sb_2Te_5$ contained in a phase-change material layer 7 varies between an amorphous state and a crystal state. Resistance is high in an amorphous state and low in a crystal state. Consequently, readout is carried out by giving a potential difference to both the terminals of a resistance change element, measuring the electric current flowing in the element, and judging whether the element is in a high resistance state or in a low resistance state.

Operation of changing a phase-change material from an amorphous state of a high resistance to a crystal state of a low resistance, namely set operation, can be carried out by heating the phase-change material of an amorphous state to a temperature not lower than a crystallization temperature, maintaining it at the temperature for not less than about $10^{-6}$ sec., and thereby changing it into a crystal state. Meanwhile, the phase-change material of a crystal state can be changed into an amorphous state by heating the phase-change material to a temperature not lower than a melting point and thus making it in a liquid state and successively cooling it rapidly.

<Selective Operation in Z Direction>

Figure 4:
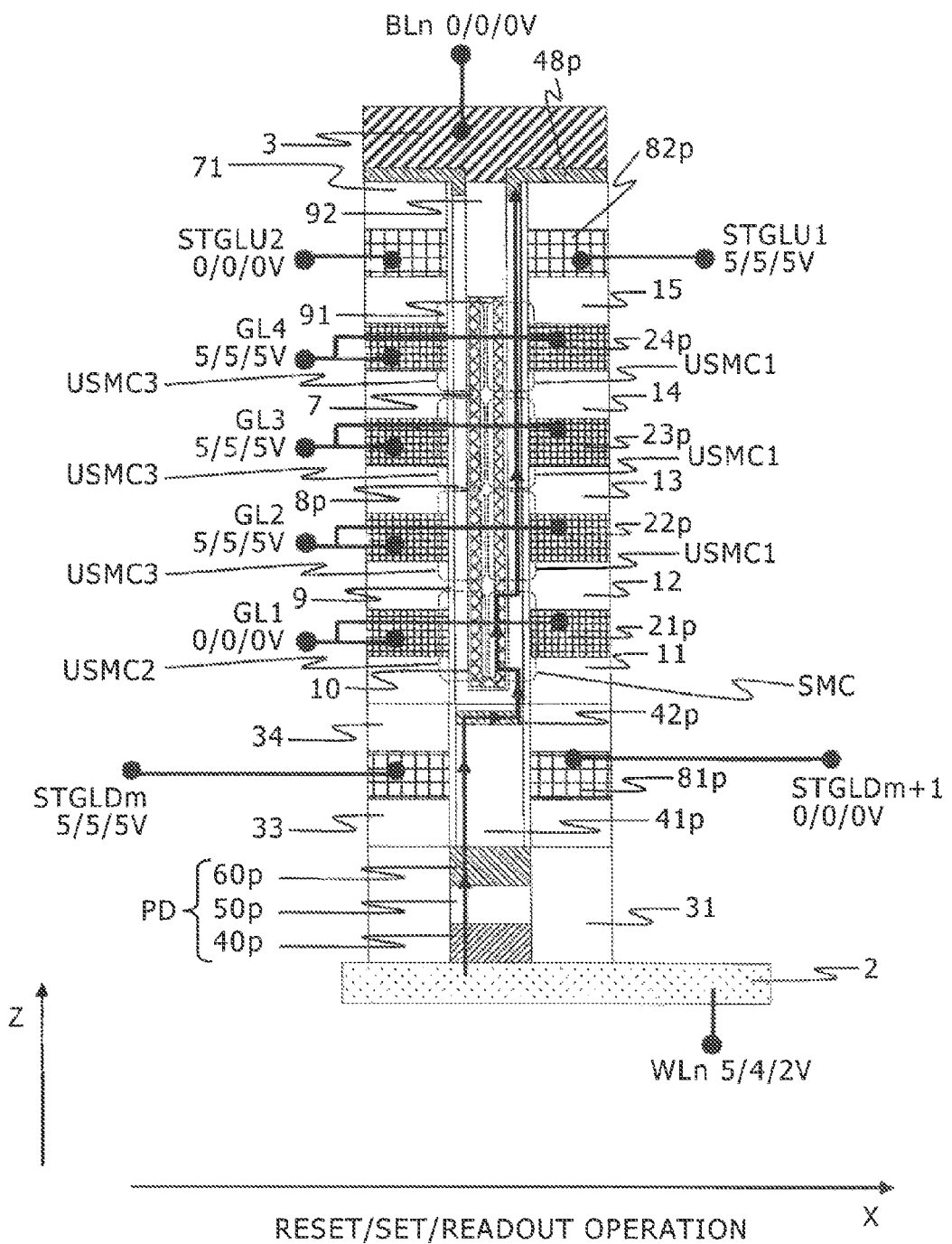
FIG. 4 is a view explaining operations of increasing and decreasing the resistance of a phase-change memory according to the first embodiment of the present invention.

FIG. 4 shows a part extracted from a cross section of the memory cell array MA of FIG. 3 on an XZ plane. An insulation film layer 31 is an insulation film embedded into a space between PDs although it is omitted in FIGS. 1, 2, and 3 for simplicity's sake.

In such a cell formed by serially coupling memory cells formed by parallel coupling transistors and phase-change elements, namely a chain cell, the following operation is carried out for example (in the following explanation, when "0 V" is merely cited, it means that 0 V is applied in any of the cases of reset operation, set operation, and readout operation). 0 V is applied to a gate line GL1 to which a selective cell SMC is coupled and a transistor having a channel polysilicon layer 8$p$ as a channel is put into an off-state. 5 V is applied to gate lines GL2, GL3, and GL4 to which the selective cell SMC is not coupled and transistors are put into an on-state. 0 V is applied to a bit line BL1 and 5 V, 4 V, and 2 V are applied to a word line WL1 at reset operation, set operation, and readout operation respectively. In the gate polysilicon of a selective transistor, 5 V is applied to a gate on the side coupled to SMC, namely STGLU1, and a transistor is put into an on-state. 0 V is applied to a gate on the side not coupled to SMC, namely STGLU2, and a transistor is put into an off-state. Further, in a selective transistor immediately over a diode PD, only STGLDm on the side opposite to a selective cell is put into an on-state. Here, selective transistor gates immediately under a metal wire 3 are bundled in a manner of skipping two gates and coupled to metal wires STGLU1, STGLU2, and STGLU3. In contrast, each of selective transistors immediately over the diode PD is coupled to a metal wire individually so that an independent potential may be supplied.

Figure 5:
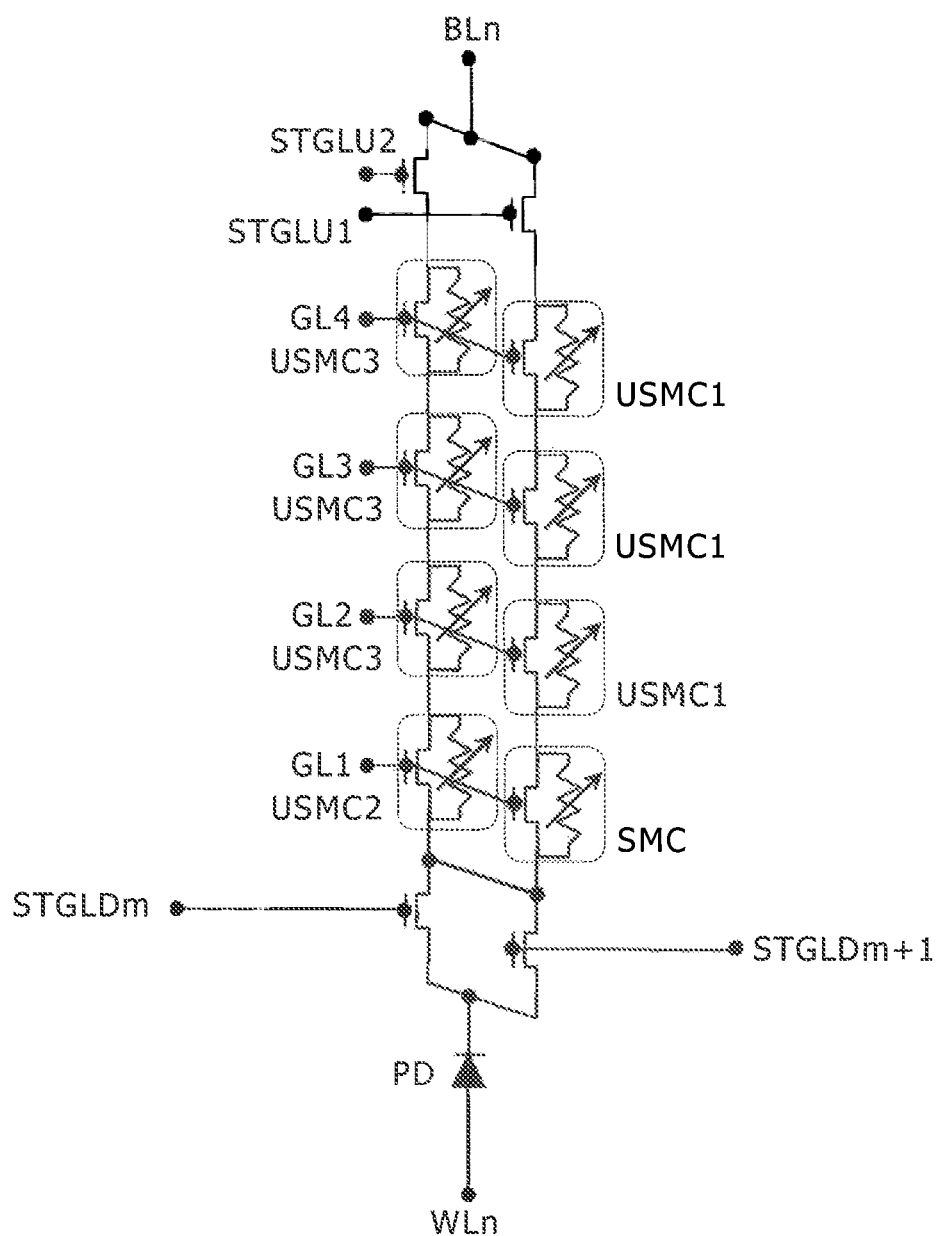
FIG. 5 is an equivalent circuit diagram of a phase-change memory according to the first embodiment of the present invention.

In a non-selective cell USMC1, the resistance of a channel is low when a transistor is in an on-state and the resistance of a channel polysilicon layer 8$p$ of STGL1 in an on-state is also low. It is possible to make a nearly identical electric current flow regardless of the state of a phase-change material layer 7 at an USMC1 section. In SMC, the transistor is in an off-state and hence electric current flows in the phase-change material layer 7. At the time of reset operation and set operation, operation is carried out by changing the resistance value of the phase-change material 7 by electric current flowing in the phase-change material layer 7 at SMC. At the time of readout operation, operation is carried out by judging the value of electric current flowing in the phase-change material layer 7 at SMC. The gate voltages of the transistors of non-selective cells USMC2 and USMC3 are shared with the transistors of SMC and USMC1 respectively and hence the transistor of USMC2 is in an off-state and the transistors of USMC3 are in an on-state. The selective transistor in which STGLU2 is coupled to the gate polysilicon layer 82$p$ is in an off-state and hence electric current routed through USMC2 and USMC3 does not flow. Consequently, electric current flows in the phase-change material layer 7 only at SMC and selective operation can be carried out. An equivalent circuit diagram of a memory cell array section in FIG. 4 is shown in FIG. 5. In this way, it is obvious that selective operation in the Z direction can be carried out.

<Selective Operation in X Direction>

Figure 6:
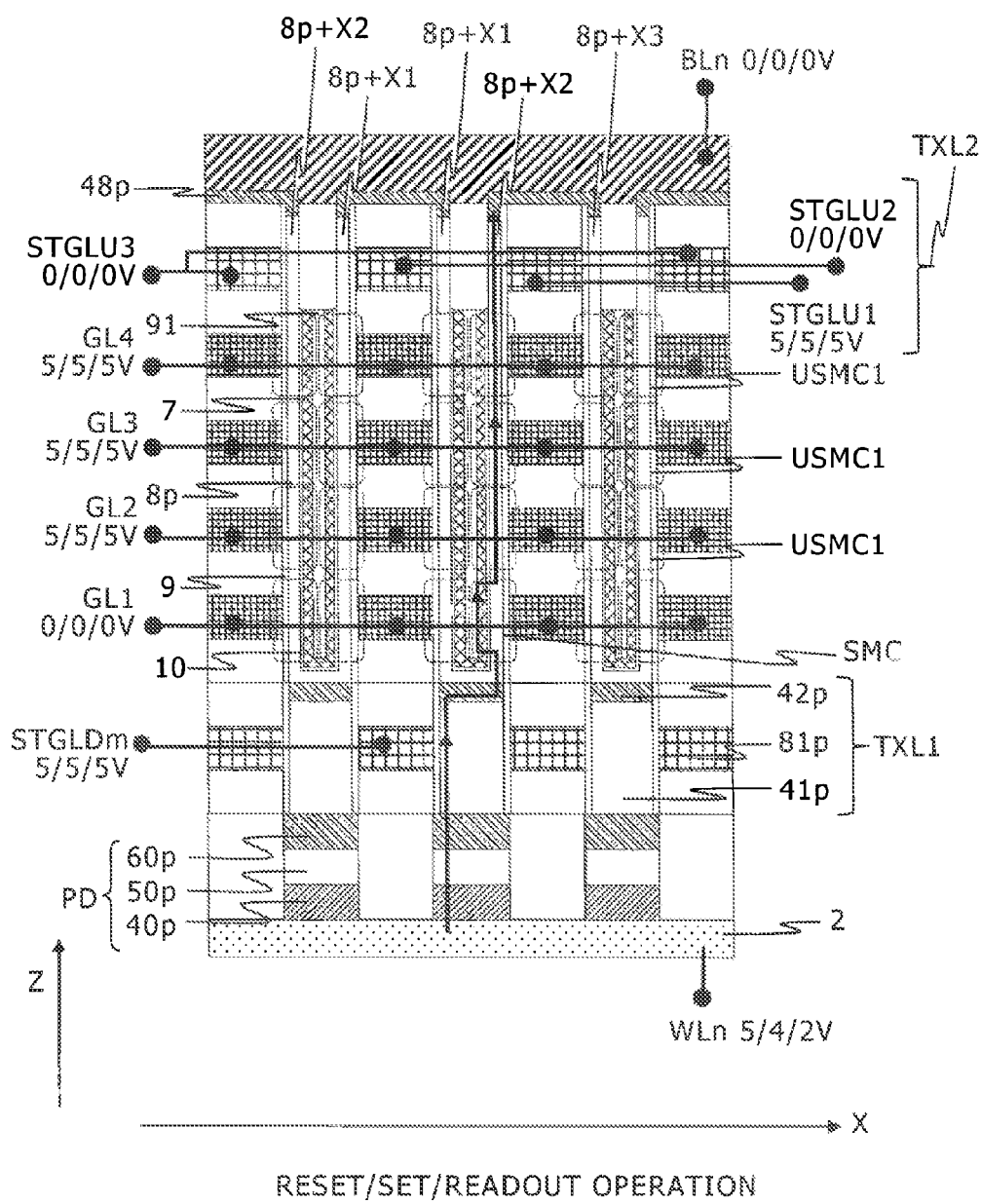
FIG. 6 is a view explaining reset operation, set operation, and readout operation of a memory cell array according to the first embodiment of the present invention.

FIG. 6 is a sectional view on an XZ plane in FIG. 3 and shows relationship between selective transistors and gate wires GL1, GL2, GL3, and GL4 when reset operation, set operation, and readout operation are carried out. In the same manner as FIG. 4, the potentials 5/4/2 V of WLn are the potentials at reset operation, set operation, and readout operation respectively. Likewise, the expressions on the potentials of other terminals in FIG. 6 represent the potentials of the reset operation, the set operation, and the readout operation in sequence. When only STGLDm is put into an on-state in a selective transistor on the lower side and STGLU1 is put into an on-state in a selective transistor on the upper side, a path through which electric current flows is limited to a route including a selective cell SMC.

The above explanations are summarized as follows. Selective operation of a memory array MA in the X direction is allowed by: X selective transistor layers TXL1 including first gate semiconductor layers and first channels; and X selective transistor layers TXL2 including the combination of third gate semiconductor layers and second channels and the combination of the third gate semiconductor layers and the second channels.

The reason is as follows (hereinafter, with regard to a channel layer 8$p$, a channel layer formed on the +X side of a laminated body including gate semiconductor layers is represented by 8$p$+X and a channel layer formed on the -X side is represented by 8$p$-X and the trailing numerals are attached numbers).

In the X selective transistor layers TXL1, the channel layers on the +X side and the -X side are selected simultaneously. As shown in FIG. 6 for example, when 5/5/5 V is applied to STGLDm, channel layers 18$p$+X1 and 8$p$-X1 are selected and coupled electrically to diode layers PD. However, channel layers selected in the X selective transistor layers TXL1 are not limited to the two channel layers. The reason is that channel layers 18$p$+X1 and 18$p$-X2 can be coupled electrically to a diode layer PD simultaneously and channel layers 8$p$-X1 and 8$p$+X2 can be coupled electrically to a diode layer PD simultaneously by channel layers 41$p$ and polysilicon layers 42$p$. That is, the channel layers selected when 5/5/5 V is applied to STGLDm are four channel layers of 8$p$+X1, 8$p$-X1, 8$p$+X2, and 8$p$-X2 and the X selective transistor layers TXL1 are transistor layers to select four channel layers in total.

In contrast, the number of channel layers selected by the X selective transistor layers TXL2 is two. As shown in FIG. 6 for example, channel layers selected when 5/5/5 V is applied to STGLU1 are merely 8$p$-X2 and 8$p$+X3. Consequently, the channel layers selected by the X selective transistor layers TXL2 are the two channel layers coupled directly through insulation films.

In the light of the situation, as shown in FIG. 6, it is possible to select one channel layer in the X direction by shifting gate semiconductor layers to be in a selective state one-by-one in the X direction in the X selective transistor layers TXL1 and TXL2. In FIG. 6, since the four channel layers of 8$p$+X1, 8$p$-X1, 8$p$+X2, and 8$p$-X2 are in a selective state in TXL1, the two channel layers of 8$p$-X2 and 8$p$+X3 are in a selective state in TXL2, and other channel layers are in a non-selective state, resultantly the channel layer that is in a selective state and allows electric current to flow is only 8$p$-X2 that is selected by both TXL1 and TXL2. As a result, the configuration of the present embodiment makes it possible to carry out selective operation in the X direction.

<Selective Operation in Y Direction and First Bundling Method>

Figure 7:
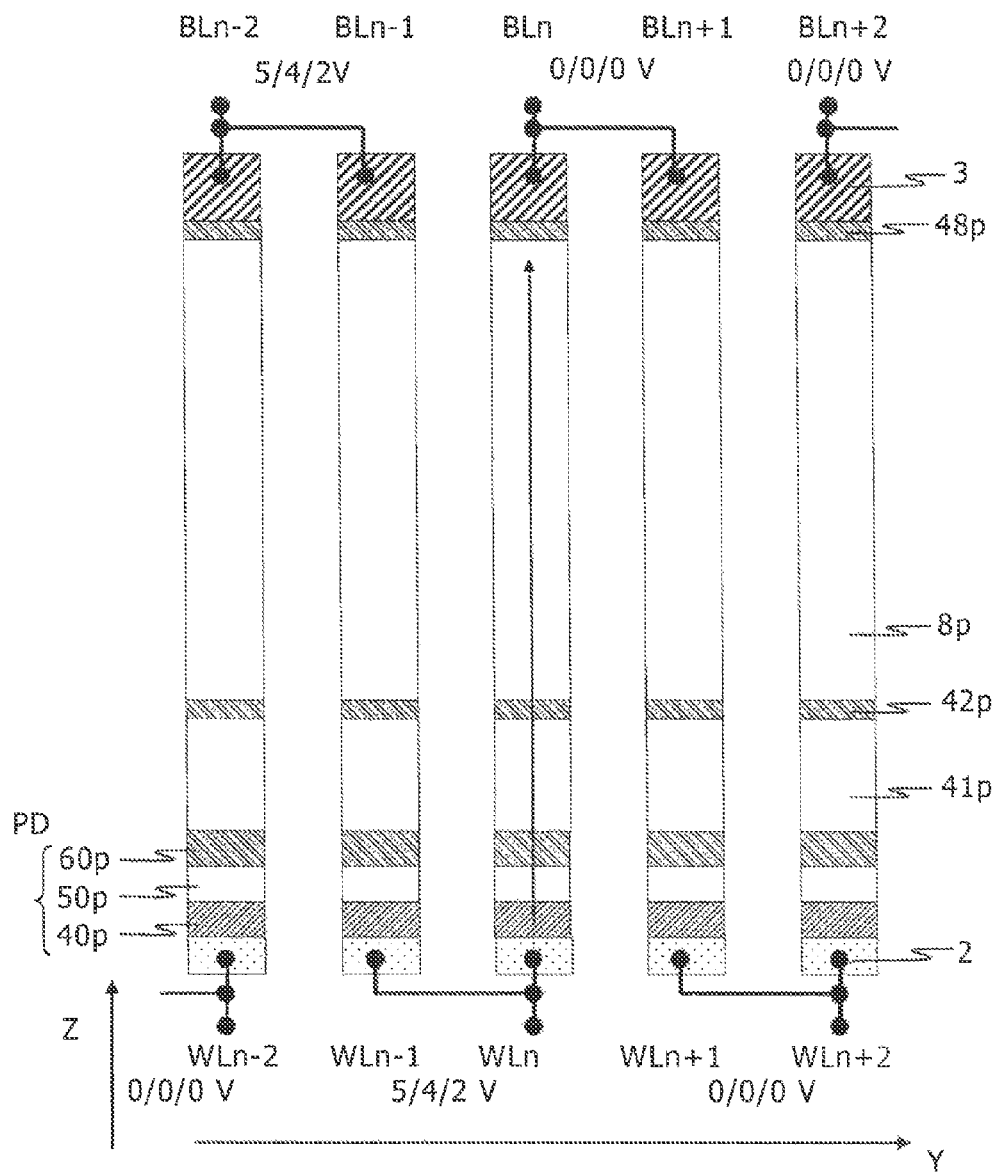
FIG. 7 is a view explaining reset operation, set operation, and readout operation of a memory cell array according to the first embodiment of the present invention.

FIG. 7 shows a cross section of the memory array MA in FIG. 3 on the YZ plane particularly at a polysilicon 8$p$. For example, the potential of a pair (WLn-1 and WLn) and a pair (BLn-2 and BLn-1) is set at 5/4/2 V at reset operation, set operation, and readout operation. The potential of all other wires is set at 0 V. Electric current flows between WLn and BLn because a forward bias is applied to PD. Electric current does not flow between WLn-1 and BLn-1, between WLn+1 and BLn+1, and between others because the potential is equal. Electric current does not flow between WLn-2 and BLn-2 because a reverse bias is applied to PD. Consequently, it is obvious that such a configuration makes it possible to carry out selection in the Y direction.

In this way, it is obvious that such a configuration according to the present embodiment makes it possible to: carry out selective operations in all the X, Y, and Z directions; and operate only a selective cell SMC For example, operation of setting the potential of a pair (WLn−1 and WLn) and a pair (BLn−2 and BLn−1) at 5/4/2 V at reset operation, set operation, and readout operation, applying 0 V to a pair (BLn and BLn+1), setting all other lower wires at 0 V, and setting all other upper wires at 5/4/2 V can also be carried out.

Here, a selective chain is not necessarily limited to a chain between WLn and BLn and for example it is possible to select two chains between WLn and BLn and between WLn−4 and BLn−4 having the same coordinates in the X and Y directions by setting the potential of (WLn−1 and WLn), (WLn−5 and WLn−4), (BLn−2 and BLn−1), and (BLn−6 and BLn−5) at 5/4/2 V at reset operation, set operation, and readout operation and the potential of all other wires at 0 V.

Figure 8:
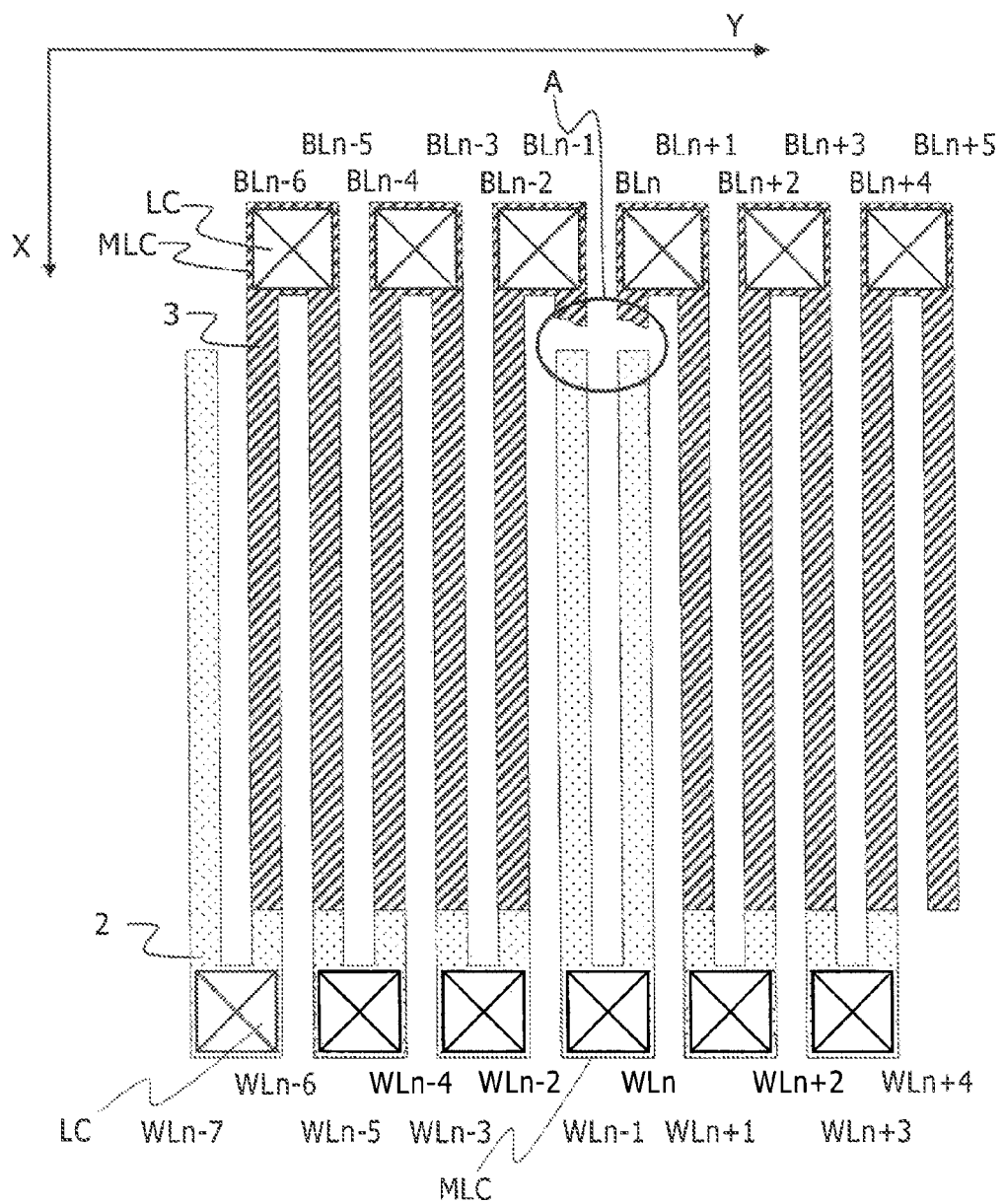
FIG. 8 is a view explaining a layout of contact sections of upper electrode wires and lower electrode wires in a memory cell array according to the first embodiment of the present invention.

A layout of word lines 2, bit lines 3, and contacts LC for materializing wire connection in FIG. 7 is shown in FIG. 8. Respective adjacent two wires are bundled and contacts LC are formed at bundling sections MLC having increased areas. In FIG. 8, the contacts of the word lines 2 and the bit lines 3 are formed on respective sides of an array. Here, bit lines 3 are omitted at A in FIG. 8 in order to clarify the layout of the word lines 2.

In this way, the characteristics of FIGS. 7 and 8 are that: respective adjacent two word lines are bundled; respective adjacent two bit lines are bundled; and two bit lines formed vertically over bundled two word lines are separated electrically. Such a configuration makes it possible to carry out selective operation in the Y direction while contact resistance is lowered at respective bundling sections of the word lines and the bit lines. On top of that, it makes it possible to further simplify a wiring pattern in comparison with another wiring method described later.

<Second Bundling Method>

Figure 9:
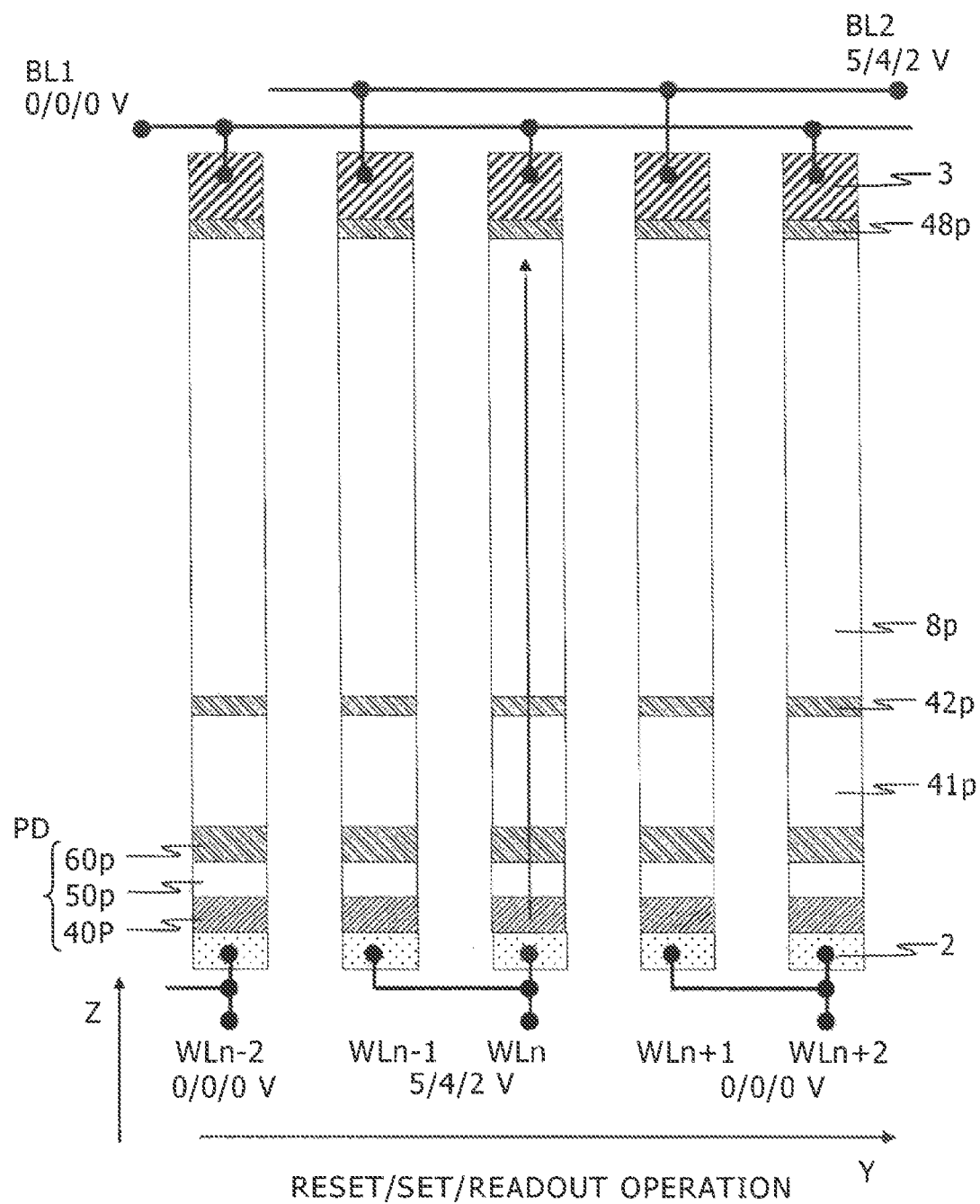
FIG. 9 is a view explaining voltage applied during operation to upper electrode wires and lower electrode wires in a memory cell array according to the first embodiment of the present invention.
Figure 10:
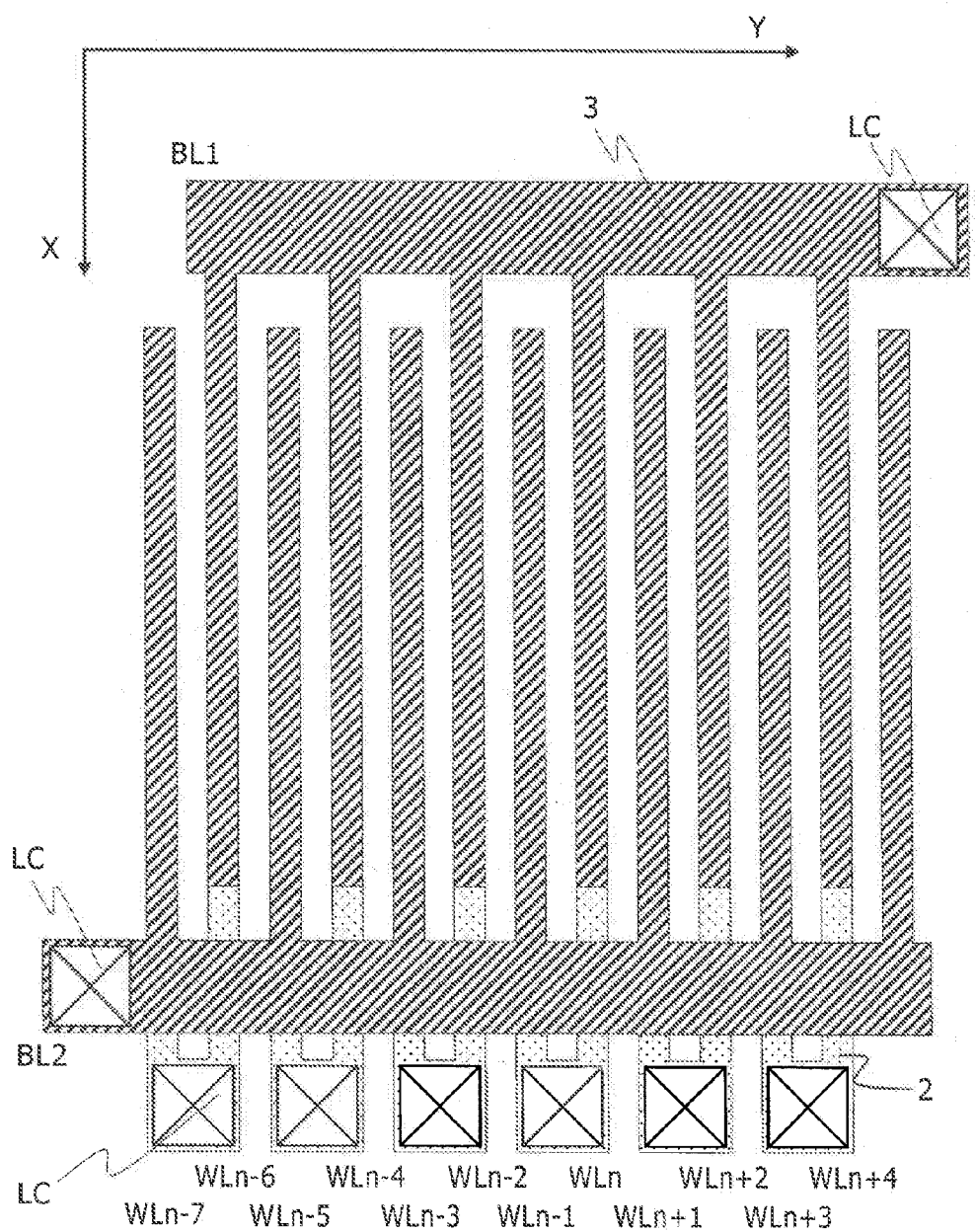
FIG. 10 is a view explaining a layout of contact sections of upper electrode wires and lower electrode wires in a memory cell array according to the first embodiment of the present invention.

The method for bundling word lines 2 and bit lines 3 is not limited to the method shown in FIGS. 7 and 8. An example of another method is shown in FIGS. 9 and 10. FIG. 9 shows a cross section on the YZ plane in FIG. 3 particular at a polysilicon 8p. Adjacent two wires are bundled in the same manner as FIG. 7 with regard to the word lines 2 but every two wires are bundled alternately with regard to the bit lines 3. 5/4/2 V is applied to the pair (WLn−1 and WLn) at reset operation, set operation, and readout operation respectively, 0 V is applied to BL1 coupled through a route including a selective cell, and the potential identical to the pair (WLn−1 and WLn) is applied to the other BL2. Electric current flows between WLn and BL1 because a forward bias is applied to PD. Electric current does not flow between WLn−1 and BL2 because the same potential is applied. Electric current does not flow between WLn−2 and BL1 and between others because the same potential is applied. Electric current does not flow between WLn+1 and BL2 and between others because a reverse bias is applied to PD. Consequently, electric current can flow only between WLn and BL1 and selection in the Y direction can be carried out in the same manner as the example of FIGS. 7 and 8. A layout corresponding to the bundling method in FIG. 9 is shown in FIG. 10. The all contacts of the wires 2 are formed on one side. With regard to the upper wires 3, even-numbered wires and odd-numbered wires are bundled and contacts are formed on both the sides of an array respectively. Each of the contacts LC is formed at a bundling section MLC having an increased area. Resistance can be lowered because a large contact LC can be formed and moreover the number of contacts can be reduced because only two contacts corresponding to BL1 and BL2 are required in comparison with the layout in FIG. 8. Further, with regard to a driver circuit, the number can be reduced because only two driver circuits corresponding to BL1 and BL2 are required.

In this way, the bundling method of FIGS. 9 and 10 is characterized in that: adjacent two word lines are bundled respectively; and odd-numbered bit lines and even-numbered bit lines are bundled respectively. Such a characteristic makes it possible to lower a contact resistance and further reduce the number of contacts and the number of driver circuits.

Here, a selective cell is not necessarily limited to the chain of WLn and BL1 and for example the potential of the pairs (WLn−1 and WLn) and (WLn+1 and WLn+2) and BL2 is set at 5/4/2 V at reset operation, set operation, and readout operation and the potential of all other wires is set at 0 V. It is possible to select two chains between WLn and BL1 and between WLn+2 and BL1 having the same coordinates in the X and Z directions.

<Third Bundling Method>

Figure 11:
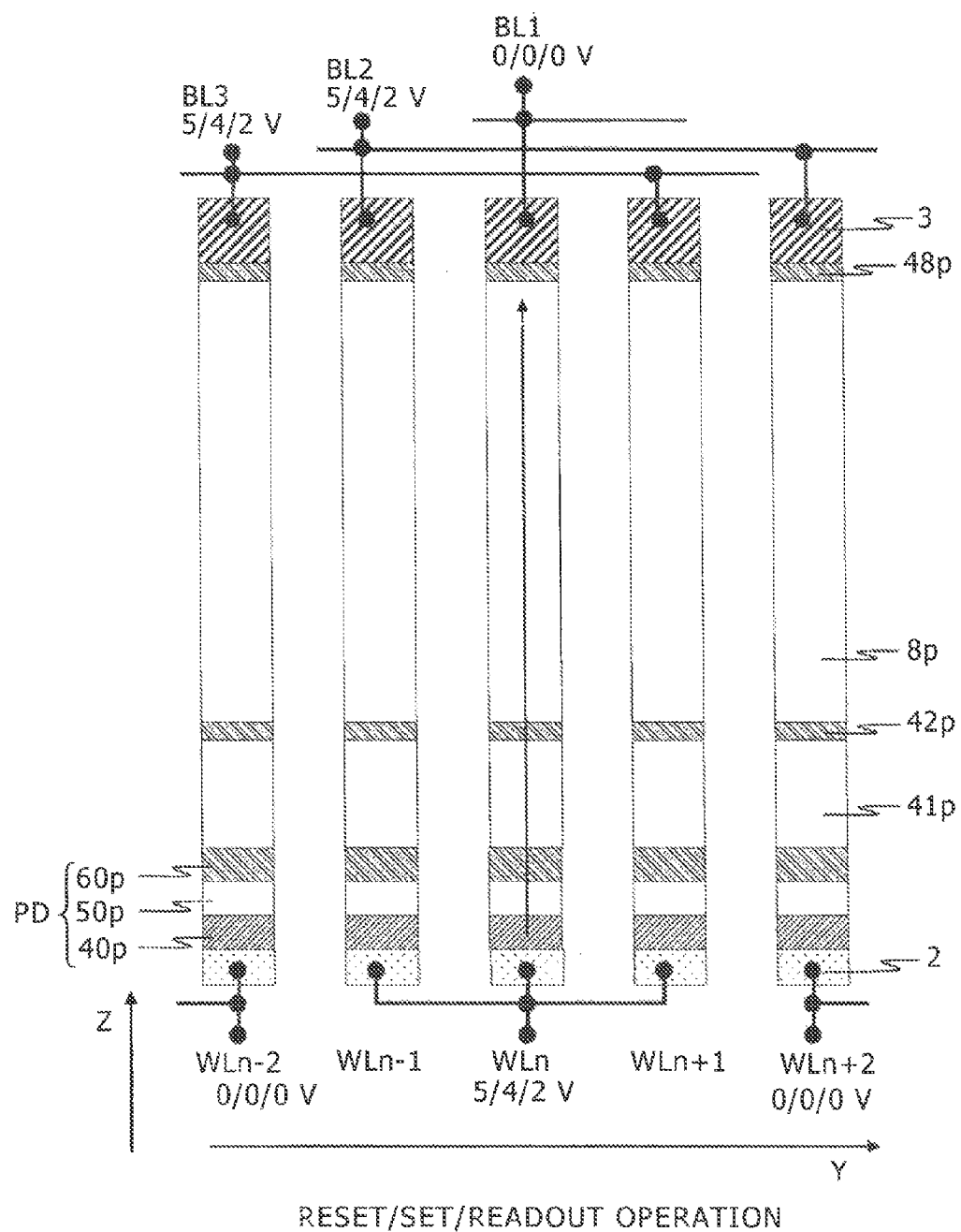
FIG. 11 is a view explaining voltage applied during operation to upper electrode wires and lower electrode wires in a memory cell array according to the first embodiment of the present invention.
Figure 12:
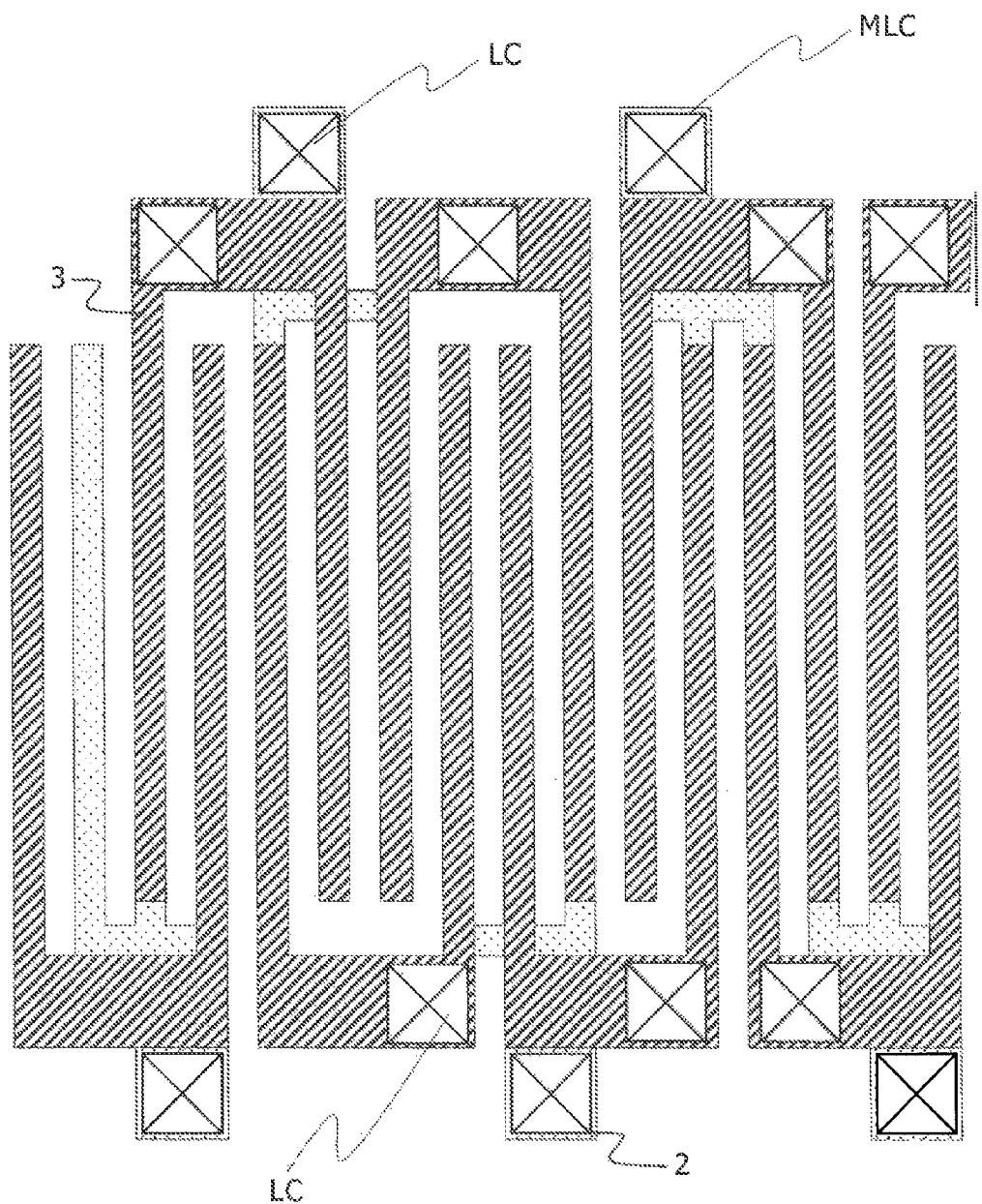
FIG. 12 is a view explaining a layout of contact sections of upper electrode wires and lower electrode wires in a memory cell array according to the first embodiment of the present invention.

An example of still another bundling method is shown in FIGS. 11 and 12. FIG. 11 shows a cross section viewed in the Y direction at a polysilicon 8p. With regard to word lines 2, three consecutive wires are bundled. With regard to bit lines 3, every third bit lines 3 are bundled. 5/4/2 V is applied to the combination of (WLn−1, WLn, and WLn+1) at reset operation, set operation, and readout operation respectively, 0 V is applied to BL1 coupled through a route including a selective cell, and the same potential as the combination of (WLn−1, WLn, and WLn+1) is applied to other BL2 and BL3. Electric current flows between WLn and BL1 because a forward bias is applied to PD. Electric current does not flow between WLn−1 and BL2 and between WLn+1 and BL3 because the same potential is applied. Electric current does not flow between WLn−3 and BL1 and between others because the same potential is applied. Electric current does not flow between WLn+2 and BL2, between WLn−2 and BL3, and between others because a reverse bias is applied to PD. As a result, it is possible to flow electric current only between WLn and BL1 and carry out selection in the Y direction in the same manner as the example of FIGS. 7 and 8 and the example of FIGS. 9 and 10. A layout corresponding to the bundling method in FIG. 11 is shown in FIG. 12. Each of the contacts LC is formed at a bundling section MLC having an increased area. Resistance can be lowered because a large contact LC can be formed. Further, the effect of reducing the number of driver circuits to drive word lines in comparison with the layouts in FIGS. 8 and 10 is obtained.

In this way, the bundling method shown in FIGS. 11 and 12 is characterized in that: adjacent three word lines are bundled respectively; and 3mth, (3m+1)th, and (3m+2)th (m represents a natural number) bit lines are bundled. Such a configuration makes it possible to reduce the number of driver circuits to drive word lines while a contact resistance is lowered.

Here, a selective cell is not necessarily limited to the chain of WLn and BL1 and for example the potential of the combination of (WLn−1, WLn, and WLn+1), the combination of (WLn+2, WLn+3, and WLn+4), BL2, and BL3 is set at 5/4/2 V at reset operation, set operation, and readout operation respectively and the potential of all other wires is set at 0 V. It is possible to select two chains between WLn and BL1 and between WLn+3 and BL1 having the same coordinates in the X and Z directions.

<Summary of Bundling Method and Selective Operation>

Voltage conditions for carrying out selective operation in the Y direction by the three types of wire bundling methods in the first embodiment are summarized in FIG. 13.

Figure 14:
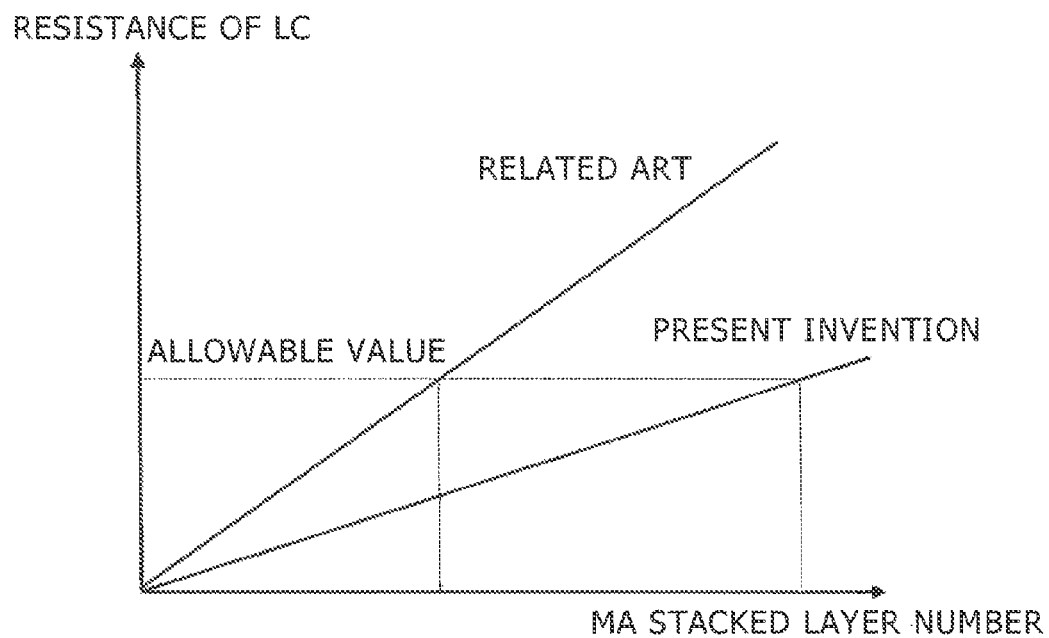
FIG. 14 is a graph showing an effect of a semiconductor memory device according to the first embodiment of the present invention.

In a semiconductor memory device according to the first embodiment, it is possible to form a contact LC of an increased size by bundling wires and hence lower contact resistance. Consequently, the semiconductor memory device is advantageous in the case of promoting the lamination of MA as shown in FIG. 2 in comparison with the case of forming one contact for one wire. Trends in the increase of contact resistance in response to the increase of an MA stacked layer number are compared between related art and the technology according to the present invention in FIG. 14. By using the technology according to the present invention, it is possible to further increase an MA stacked layer number and promote the capacity increase of a semiconductor memory device.

<Modification of Diode Layer>

A modification of diode layers PD is shown in FIG. 15. Although diodes PD are formed into a pillar shape and exist only at lower parts of the space formed by removing laminated films comprising 21p to 24p and others in FIG. 3, the diode layers PD may extend in the X direction. Such a configuration makes it possible to: omit a process of forming diode layers PD into a pillar shape and a process of filling the space with insulation films 31; and reduce manufacturing costs. Adjacent PDs however have to be separated from each other in the Y direction in FIG. 15. Selection in the X direction is carried out by the method explained in FIG. 6.

As a bundling method of metal wires, a method similar to the method stated earlier can be used. As a result, it is possible to increase an MA stacked layer number and promote the capacity increase of a semiconductor memory device.

Second Embodiment

Figure 16:
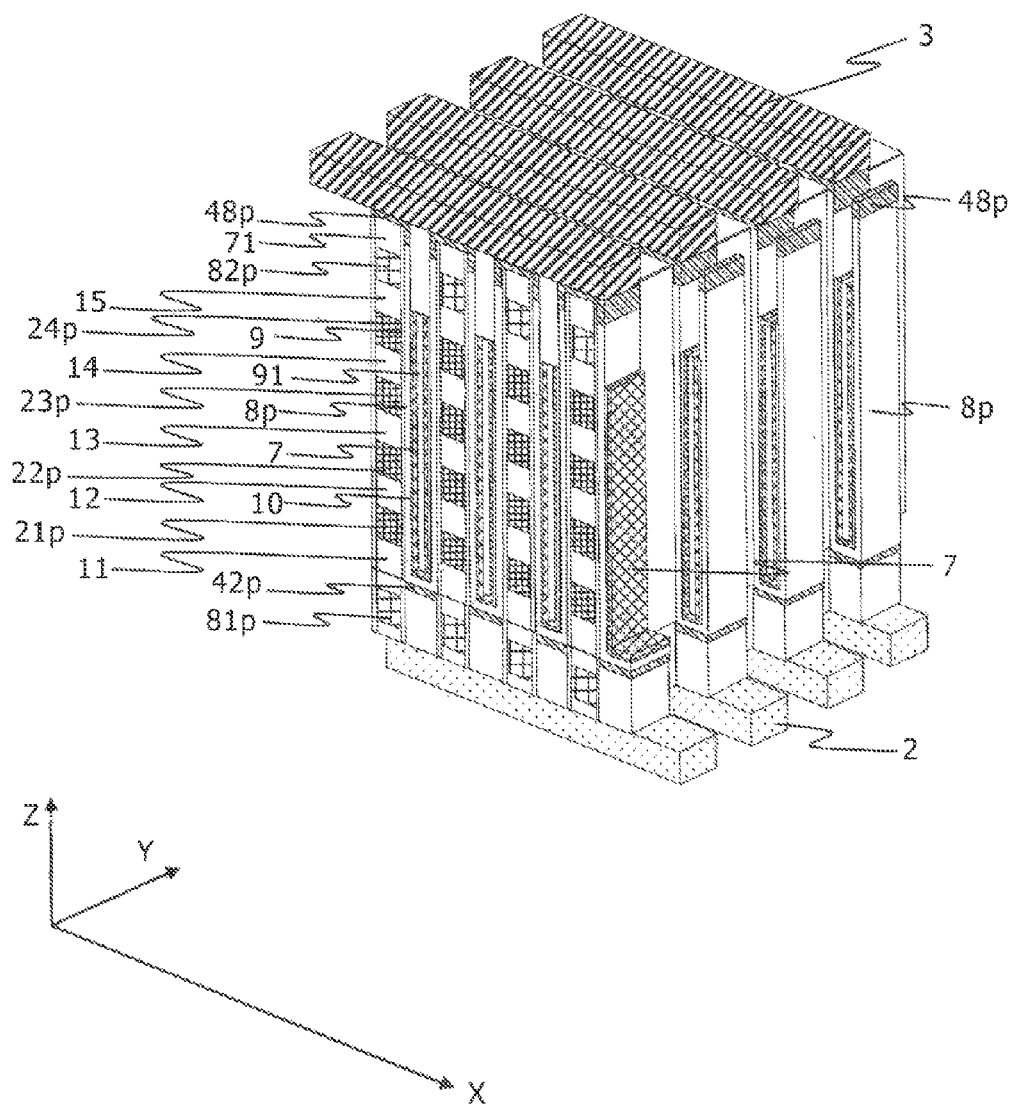
FIG. 16 is a partial schematic stereograph of a memory cell array according to a second embodiment of the present invention.
Figure 17A:
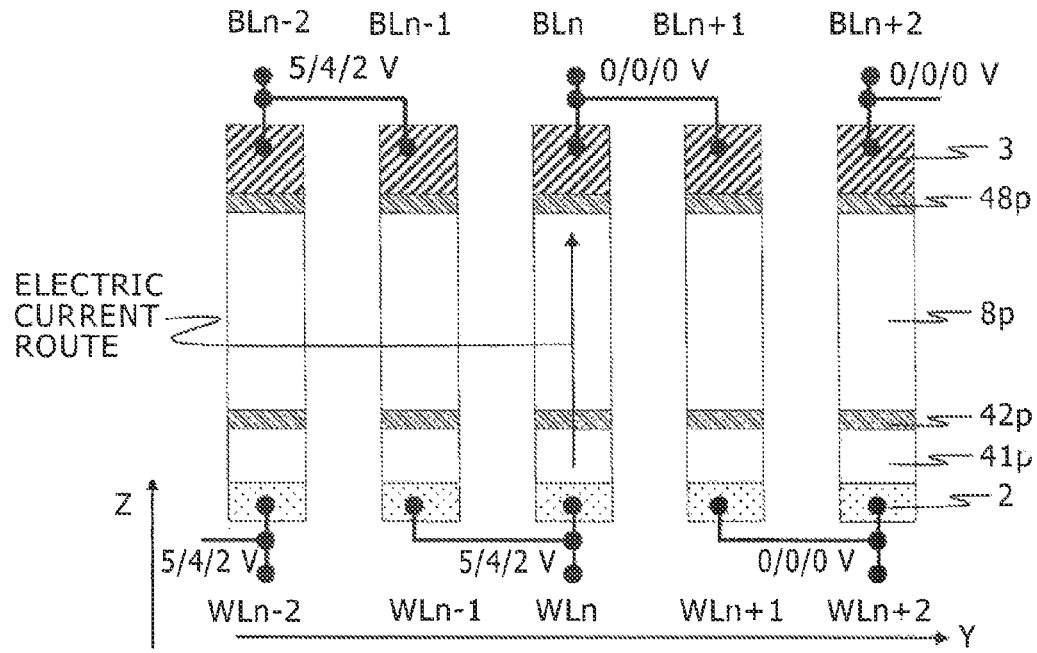
FIGS. 17A and 17B are views explaining voltage applied during operation to upper electrode wires and lower electrode wires in a memory cell array according to the second embodiment of the present invention.
Figure 17B:
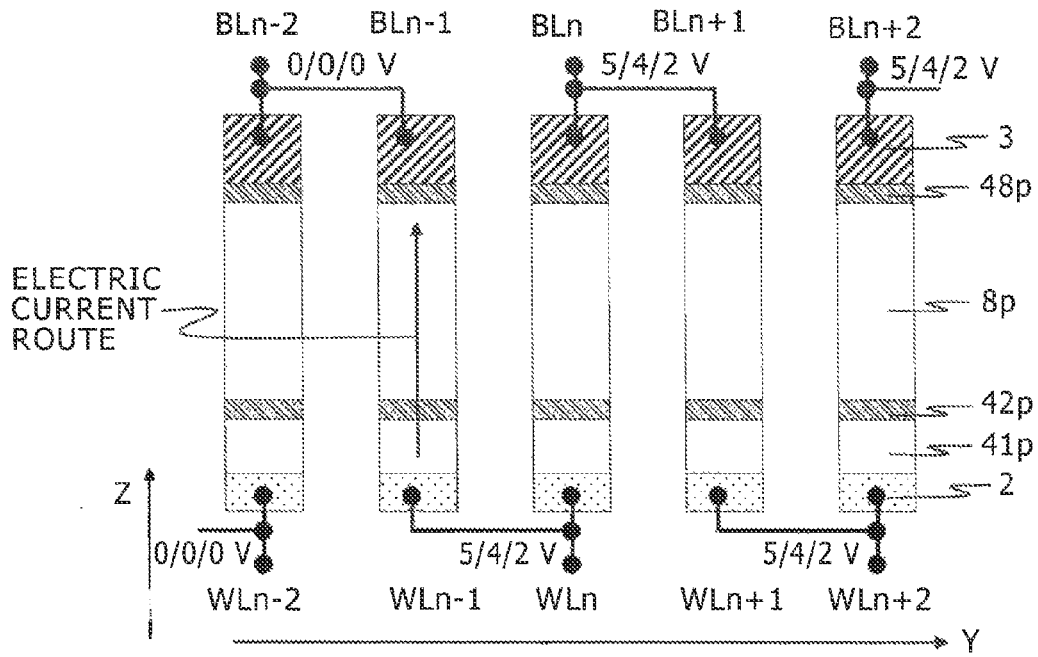

FIG. 16 is a partial schematic stereograph of a semiconductor memory device according to a second embodiment of the present invention and parts of a memory cell array, wires, and contacts are shown. Difference from the first embodiment is that no diode layers PD are used in the second embodiment. FIGS. 17A and 17B are views showing cross sections in the Y direction at a polysilicon 8p in the second embodiment. In both lower electrode wires (word lines) 2 and upper electrode wires (bit wires) 3, adjacent two wires are bundled in the same manner as FIG. 7.

In the case of coupling a selective chain to a word line having a larger number (the nth word line WLn in this case) in the bundled two word lines as shown in FIG. 17A, 5/4/2 V is applied to the bundled two word lines including the word line WLn at reset operation, set operation, and readout operation respectively. 0 V is applied to BLn on the other side of WLn through a selective cell. Electric current flows between WLn and BLn because potential difference is generated.

Meanwhile, since no diodes exist, electric current is prevented from flowing except between electrodes including a selective cell. Specifically, 5/4/2 V is applied to all of the word lines having numbers of n and under and the bit lines having numbers of n-1 and under in the Y direction at reset operation, set operation, and readout operation respectively and 0 V is applied to all of the word lines having numbers of n+1 and over and the bit lines having numbers of n and over in the Y direction at reset operation, set operation, and readout operation. As a result, electric current does not flow because they have the same potential except between WLn and BLn.

By the above drive method, electric current can flow only between WLn and BLn and hence it is obvious that selection in the Y direction can be carried out.

In the case of coupling a selective chain to a word line having a smaller number (the (n−1) th word line WLn−1 in this case) in the bundled two word lines as shown in FIG. 17B, 5/4/2 V is applied to the bundled two word lines including the word line WLn−1 at reset operation, set operation, and read-out operation respectively. 0 V is applied to BLn−1 on the other side of WLn−1 through a selective cell. Electric current flows between WLn−1 and BLn−1 because potential difference is generated. Since no diodes exist, in order to prevent electric current from flowing except between electrodes including the selective cell, 0 V is applied to all of the word lines having the numbers of n−2 and under and the bit lines having the numbers of n−1 and under in the Y direction at reset operation, set operation, and readout operation respectively and 5/4/2 V is applied to all of the word lines having the numbers of n−1 and over and the bit lines having the numbers of n and over in the Y direction at reset operation, set operation, and readout operation respectively. As a result, electric current does not flow because they have the same potential except between WLn−1 and BLn−1.

By the above drive method, electric current can flow only between WLn−1 and BLn−1 and hence it is obvious that selection in the Y direction can be carried out.

Here, in either of the cases shown in FIGS. 17A and 17B, selection in the X direction is carried out by the method explained in FIG. 6.

In this way, a semiconductor memory device according to the present embodiment is characterized in that: the semiconductor memory device has a plurality of word lines (2) extending in an X direction parallel to a principal, plane of a semiconductor substrate, a plurality of laminated bodies being formed cyclically in the X direction and respectively having first gate semiconductor layers (81p) formed over the word lines in the manner of extending in a Y direction intersecting the X direction and being parallel to the principal plane of the semiconductor substrate, a plurality of second gate semiconductor layers (21p to 24p) formed over the first gate semiconductor layers in the manner of extending in the Y direction and being laminated, to each other through insulation layers, and third gate semiconductor layers (82p) formed over the second gate semiconductor layers in the manner of extending in the Y direction, a plurality of first channel layers (81p) formed between the first gate semiconductor layers through insulation layers and coupled electrically to the word lines, a plurality of first gate insulation film layers (9) formed on a side and a −X side of the sides of the second gate semiconductor layers and the third gate semiconductor layers, a plurality of second channel layers (8p+X) formed cyclically in the Y direction on the +X side of the sides of the second gate semiconductor layers and the third gate semiconductor layers through the first gate insulation film layers and coupled electrically to the first channel layers, first resistance change material layers (7) being formed cyclically in the Y direction on the +X side of the sides of the second gate semiconductor layers through the first gate semiconductor layers and the second channel layers, being coupled electrically to the first channel layers, and comprising a material the resistance value of which varies in response to a flowing electric current, a plurality of third channel layers (8p−X) formed cyclically in the Y direction on the −X side of the sides of the second gate semiconductor layers and the third gate semiconductor layers through the first gate insulation film layers and coupled electrically to the first channel layers, second resistance change material layers (7) being formed cyclically in the Y direction on the −X side of the sides of the second gate semiconductor layers through the first gate semiconductor layers and the third channel layers, being coupled electrically to the first channel layers, and comprising a material the resistance value of which varies in response to a flowing electric current, and a plurality of bit lines (3) formed vertically over the respective word lines on the basis of the principal plane of the semiconductor substrate in the manner of extending in the X direction and coupled electrically to the second channels and the third channels; respective adjacent two word lines of the word lines are bundled together; respective adjacent two bit lines of the bit lines are bundled together; and two of the bit lines formed vertically over respective electrically bundled two word lines in the word lines are separated electrically.

Such a configuration makes it further possible to exclude diode layers PD while contact resistance is lowered.

With regard to applied voltage of a driver on the occasion, when a channel coupled to an mth laminated body in the laminated bodies arrayed in the Y direction through a first gate insulation film layer is selected from the second channels or the third channels (m represents an integer satisfying the expression 2≤m≤N−1), (a) in the case of bundling a word line coupled electrically to the mth laminated body with another word line coupled electrically to an (m−1)th laminated body, a first potential is applied to each of the word lines coupled to mth and under laminated bodies and each of the bit lines coupled to (m−1)th and under laminated bodies and a second potential different from the first potential is applied to each of the word lines coupled to (m+1)th and over laminated bodies and each of the hit lines coupled to the mth laminated body.

Further, (b) in the case of bundling a word line coupled electrically to the mth laminated body with another word line coupled electrically to an (m+1) th laminated body, a third potential is applied to each of the word lines coupled to mth and over laminated bodies and each of the bit lines coupled to (m+1)th and over laminated bodies and a fourth potential different from the third potential is applied to each of the word lines coupled to (m−1)th and under laminated bodies and each of the bit lines coupled to (m−1)th and under laminated bodies.

The reason is that selective operation can be carried out by applying such voltages.

Here, in the present embodiment, since no diodes PD exist, it is also possible to flow electric current in a reverse direction and operate a memory by switching voltage between an upper wire and a lower wire. That is, a driver is further characterized by being able to: switch between first operation using a potential higher than a second potential as a first potential and second operation using a potential, lower than a second potential as a first potential; and switch between third operation using a potential higher than a fourth potential as a third potential and fourth operation using a potential lower than a fourth potential as a third potential. In the operation of a vertical type memory array, when operation is carried out by setting an electrode on the upper side (bit line) at 0 V and applying a positive voltage to an electrode on the lower side (word line) in the selection of a chain, the voltage applied to a selective cell is different between the case of electing a cell close to a bit line and the case of selecting a remote cell and hence characteristics vary. The difference of the voltage applied to a selective cell is caused by the parasitic resistance (channel resistance) of a non-selective cell in a selective chain. It is possible to suppress the variation caused by the parasitic resistance of a non-selective cell in a selective chain by interchanging the voltage of a bit line and a word line between the case of selecting a cell close to the bit line and the case of selecting a cell close to the word line.

Further, a selective cell is not necessarily limited to a chain between WLn and BLn and for example it is possible to select two chains between WLn and BLn and between WLn−1 and BLn−1 having identical coordinates in the X and Z directions for example by applying 5/4/2 V to WLn−1 and WLn at reset operation, set operation, and readout operation respectively and setting the potential of all other wires at 0 V.

The layout of wires and contacts can be designed in the same manner as FIG. 8. Since the resistance of a contact LC can be lowered, it is possible to increase an MA stacked layer number and promote the capacity increase of a semiconductor memory device.

<Modification of Bundling Section>

Figure 18:
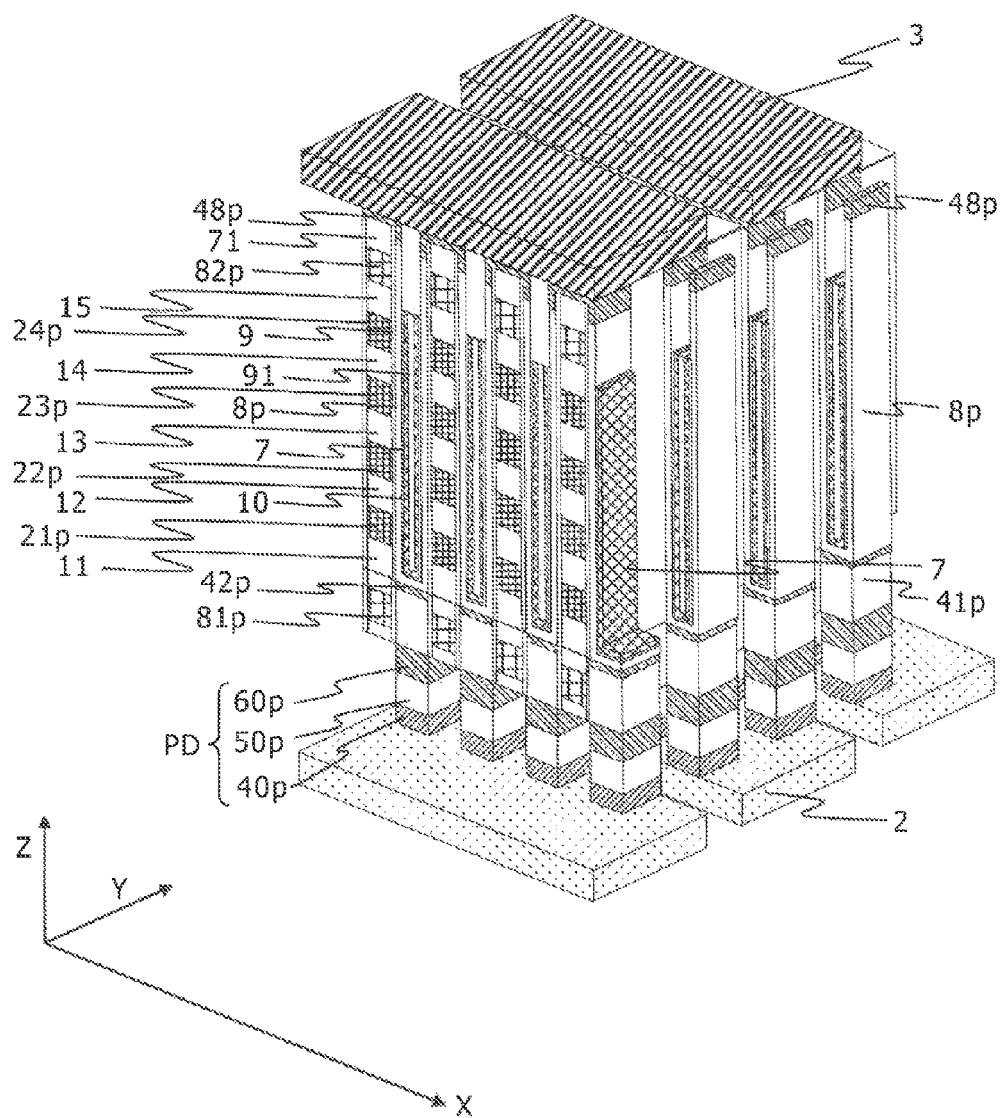
FIG. 18 is a partial schematic stereograph of a modification of a memory cell array according to the first or second embodiment of the present invention.

FIG. 18 is a modification of a bundling section and parts of a memory array, wires, and contacts are shown.

Although wires are microfabricated in conformity with the pitch of cells in an MA and bundled at bundling sections MLC outside the MA in the examples of FIGS. 7, 8, and 16, it is also possible to bundle wires in an interior. Such a configuration makes it possible to: allow wires to have shapes closer to a rectangle on an XY plane; and lower not only the resistance of a contact LC but also the resistances of word lines and bit lines because they can be thickened.

In either of the case of using diode layers PD or the case of not using diode layers PD, the layout of contacts LC at MLC sections can be designed in the same manner as FIG. 8. Such a configuration makes it possible to lower the resistance of a contact LC, hence increase an MA stacked layer number, and promote the capacity increase of a semiconductor memory device.

Third Embodiment

Although electrode wires are processed into a stripe shape in order to carry out selection in the Y direction in the first and second embodiments, it is also possible to process them into plates. That can be attained by carrying out both selection in the X direction and selection in the Y direction with selective transistors.

Figure 19:
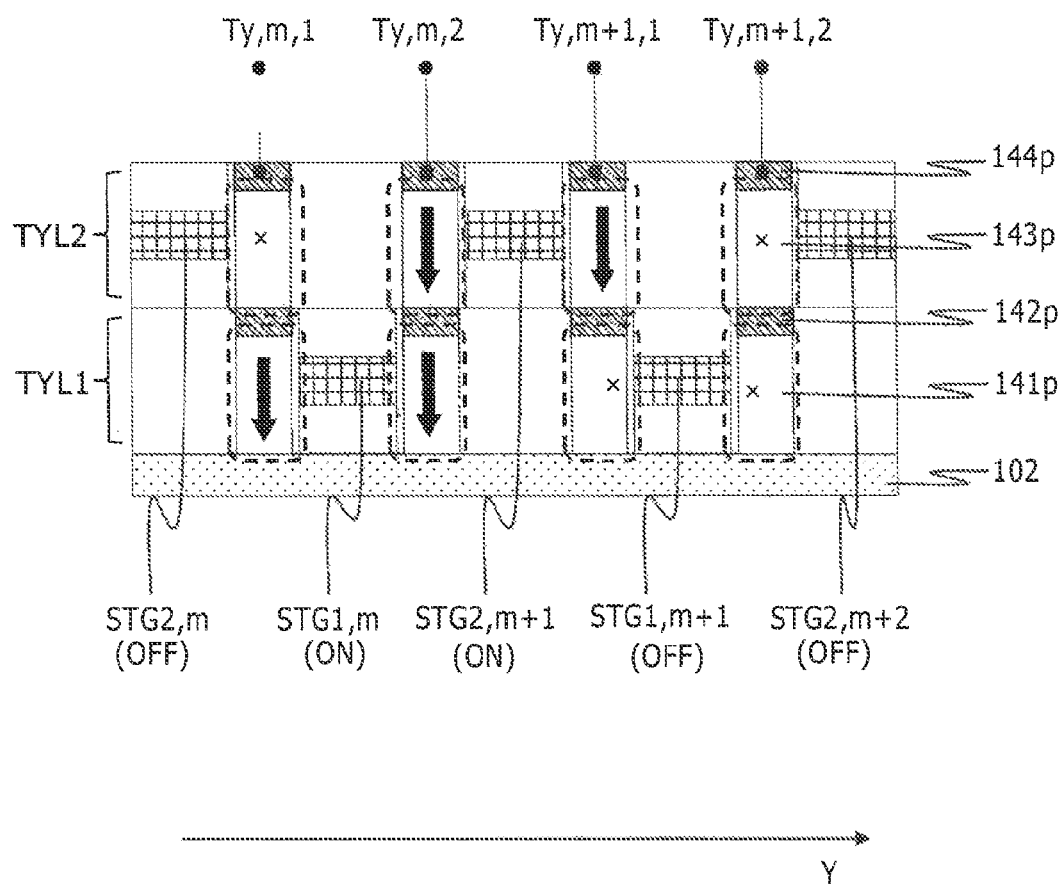
FIG. 19 is a partial sectional view of a memory cell array according to a third embodiment of the present invention.

FIG. 19 shows selective transistors to carry out selection in the Y direction and the selective transistors comprise silicons 141p to 144p over pillars divided in both the X and Y directions from two-stage stripe gates extending in the X direction, gate insulation films, and others. As shown in FIG. 19, only the channel silicon 141p at the two sites on both sides of a gate can be in an on-state by applying on-voltage only to STG1,m in a Y selective transistor layer TYL1 of the first stage. Further, the terminal communicating electrically with a lower electrode 102 is only a terminal Ty,m,2 by applying on-voltage only to STG2,m+1 in a Y selective transistor layer TYL2 of the second stage.

In this way, selective operation in the Y direction according to the present embodiment can be carried out by a first transistor layer (TYL1) being formed between a first plate (102) and a plurality of first gate semiconductor layers (81p) and selecting two channels adjacent to each other in the Y direction from a plurality of first channels (41p); and a second transistor layer (TYL2) being formed between the first transistor layer and the first gate semiconductor layers and selecting two channels adjacent to each other in the Y direction from the first channels. In, particular, in the first channels, two channels selected by the first transistor layer are different from two channels selected by the second transistor layer.

Figure 20:
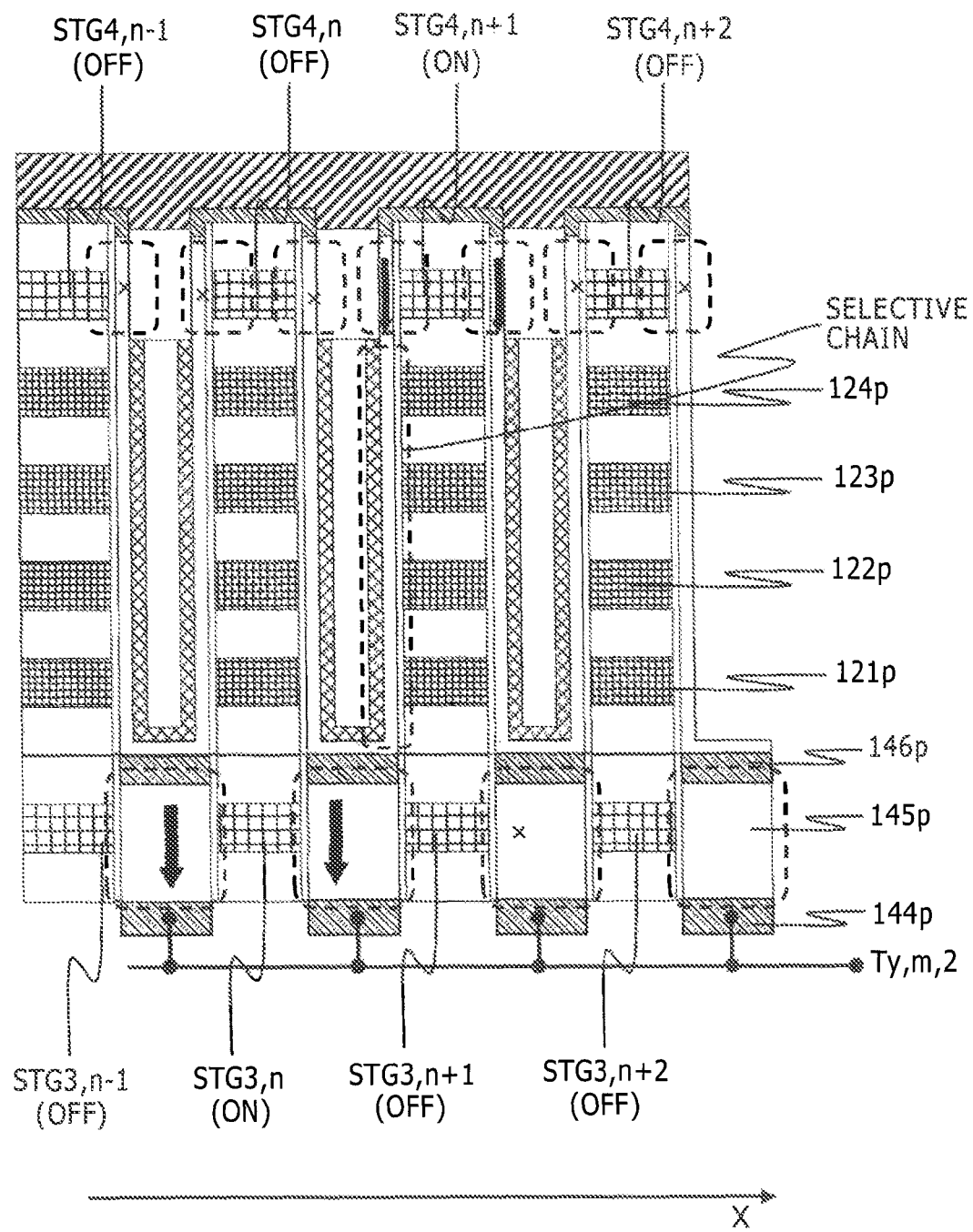
FIG. 20 is a partial sectional view of a memory cell array according to the third embodiment of the present invention.

FIG. 20 shows selective transistors to carry out selection in the X direction and shows silicons 145p and 146p over pillars divided in both the X and Y directions from single-stage stripe gates extending in the Y direction, selective transistors STG3 comprising gate insulation films and others, chain cell arrays, a bit line 3, and others. As shown in FIG. 20, only the channel silicon 145p at the two sites on both sides of a gate can be in an on—state by applying on-voltage only to STG3,n in selective gates of the first stage. Further, only one chain shown in FIG. 20 can be selected by applying on-voltage only to STG4, n+1 in selective transistors of the second stage. Consequently, the configuration in the X direction and selective operation are the same as FIG. 6.

In this way, a semiconductor memory device according to the present embodiment is characterized by having: a first plate (102) formed over a semiconductor substrate; a second plate (103) formed over the first plate; a plurality of laminated bodies being formed cyclically in an X direction intersecting a Y direction and being parallel to a principal plane of the semiconductor substrate and respectively having first gate semiconductor layers (81*p*) formed over the first plate in the manner of extending in the Y direction parallel to the principal plane of the semiconductor substrate, a plurality of second gate semiconductor layers (21*p* to 24*p*) formed over the first gate semiconductor layers in the manner of extending in the Y direction and being laminated to each other through insulation layers, and third gate semiconductor layers (82*p*) formed over the second gate semiconductor layers in the manner of extending in the Y direction; a plurality of first channel layers (41*p*) formed between the first gate semiconductor layers through insulation layers; a plurality of first gate insulation film layers (9) formed on a +X side and a −X side of the sides of the second gate semiconductor layers and the third gate semiconductor layers; a plurality of second channel layers (8*p*+X) formed cyclically in the Y direction on the −X side of the sides of the second gate semiconductor layers and the third gate semiconductor layers through the first gate insulation film layers and coupled electrically to the first channel layers and the second plate; first resistance change material layers (7) being formed cyclically in the Y direction on the +X side of the sides of the second gate semiconductor layers through the first gate semiconductor layers and the second channel layers, being coupled electrically to the first channel layers, and comprising a material the resistance value of which varies in response to a flowing electric current; a plurality of third channel layers (8*p*−X) formed cyclically in the Y direction on the −X side of the sides of the second gate semiconductor layers and the third gate semiconductor layers through the first gate insulation film layers and coupled electrically to the first channel layers and the second plate; second resistance change material layers (7) being formed cyclically in the Y direction on the −X side of the sides of the second gate semiconductor layers through the first gate semiconductor layers and the third channel layers, being coupled electrically to the first channel layers, and comprising a material the resistance value of which varies in response to a flowing electric current; first transistor layers (TYL1) being formed between the first plate and the first gate semiconductor layers and selecting two first channels adjacent to each other in the Y direction from the first channels; and second transistor layers (TYL2) being formed between the first transistor layers and the first gate semiconductor layers and selecting two first channels adjacent to each other in the Y direction from the first channels.

Figure 21:
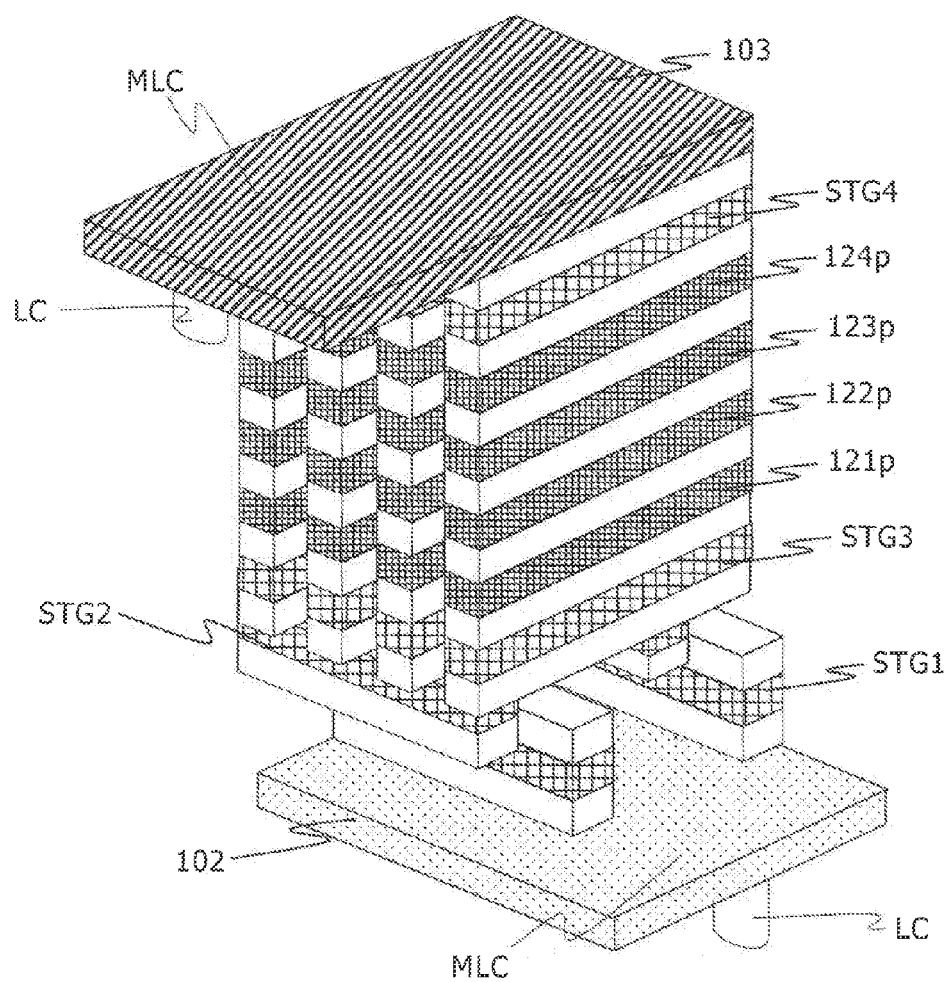
FIG. 21 is a partial schematic stereograph of a memory cell array according to the third embodiment of the present invention.

Such a configuration makes it possible to carry out selection in the Y direction by the selective method of FIG. 19 and section in the X direction by the selective method of FIG. 20. It is no longer necessary to divide an electrode 2 and apply individual voltages or to divide an electrode 3 and apply individual voltages in order to carry out selective operation in both the X and Y directions and hence the electrodes 2 and 3 can be formed into a tabular shape. FIG. 21 is a partial schematic stereograph of a semiconductor memory cell according to the present embodiment. In FIG. 21, a structure between STG1, a structure between STD2, and a structure between laminated bodies are omitted for simplicity's sake.

In the same manner as the second embodiment, no diodes PD exist and hence either of the upper and lower electrodes may have a high potential in the event of operation. That is, in the same manner as the second embodiment, it is possible to operate a memory cell by an upward electric current or by a downward electric current.

Further, in comparison with the first and second embodiments, since all the word lines 2 and all the bit lines 3 are bundled respectively, it is possible to increase the size of an MLC section and hence further increase the size of a contact LC. Consequently, it is possible to further lower the resistance of a contact LC, hence increase an MA stacked layer number, and promote the capacity increase of a semiconductor memory device.

Fourth Embodiment

Figure 22:
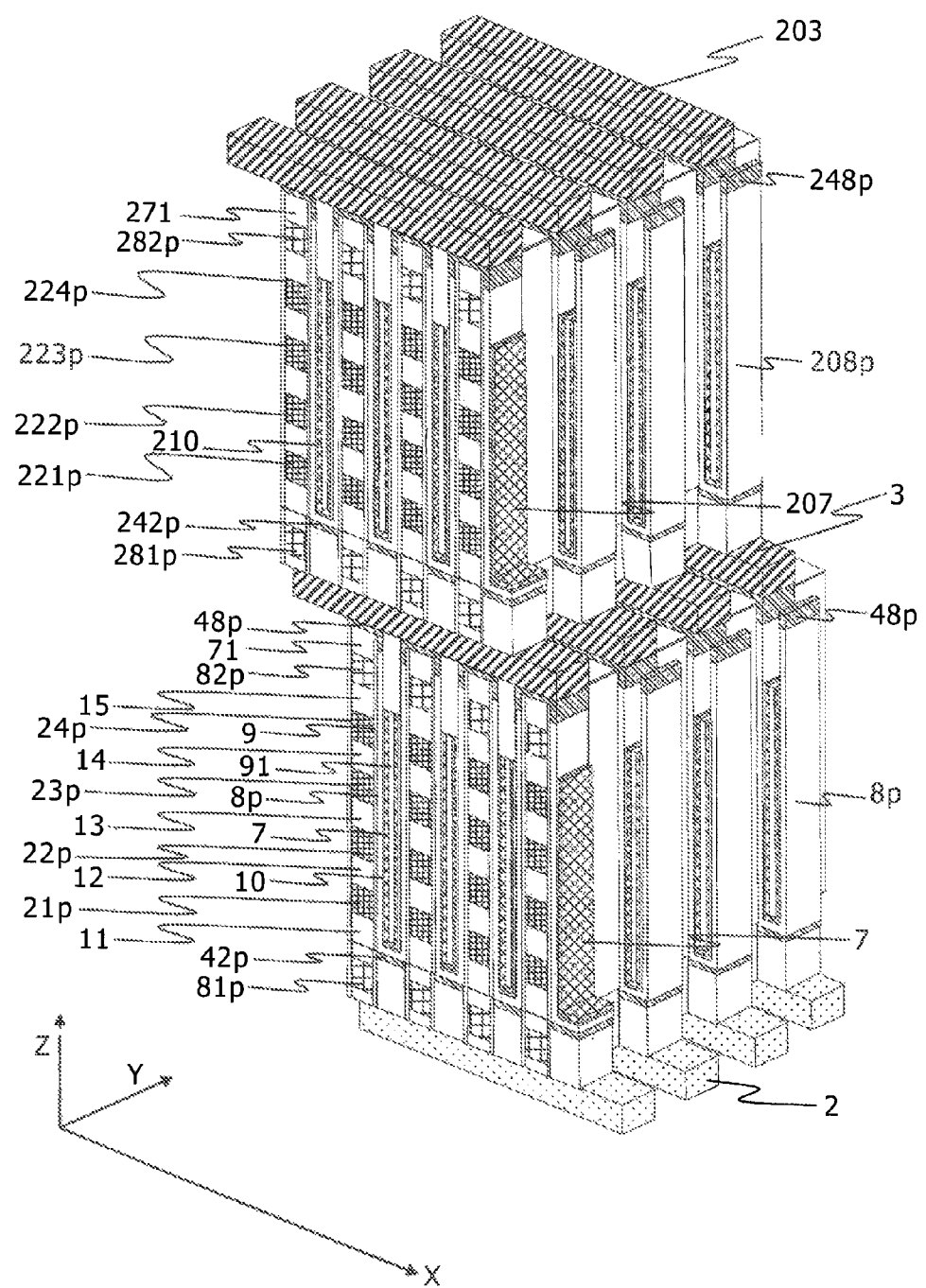
FIG. 22 is a partial schematic stereograph of a memory cell array according to a fourth embodiment of the present invention.

Although upper metal wires and lower metal wires are formed separately in respective layers when MA layers are laminated in the example of FIG. 2, it is also possible to use upper electrode wires of a lower MA layer and lower electrode wires of an upper MA layer in common as shown in FIG. 22. Which of the upper and lower MA layers should be selected is chosen by a selective transistor.

The layout of an MLC section can be designed by a method similar to the first to third embodiments. The size of a contact LC can be increased. Consequently, it is possible to lower the resistance of a contact LC, hence increase an MA stacked layer number, and promote the capacity increase of a semiconductor memory device.

What is claimed is:
1. A semiconductor memory device comprising:
a plurality of word lines extending in an X direction parallel to a principal plane of a semiconductor substrate;
a plurality of diode layers formed over the word lines;
a plurality of laminated bodies being formed cyclically in the X direction and respectively having first gate semiconductor layers formed over the diode layers in the manner of extending in a Y direction intersecting the X direction and being parallel to the principal plane of the semiconductor substrate, a plurality of second gate semiconductor layers formed over the first gate semiconductor layers in the manner of extending in the Y direction and being laminated to each other through insulation layers, and third gate semiconductor layers formed over the second gate semiconductor layers in the manner of extending in the Y direction;
a plurality of first channel layers formed between the first gate semiconductor layers through insulation layers and coupled electrically to the diode layers;
a plurality of first gate insulation film layers formed on a +X side and a −X side of the sides of the second gate semiconductor layers and the third gate semiconductor layers;
a plurality of second channel layers formed cyclically in the Y direction on the +X side of the sides of the second gate semiconductor layers and the third gate semiconductor layers through the first gate insulation film layers and coupled electrically to the first channel layers;
a plurality of first resistance change material layers being formed cyclically in the Y direction on the +X side of the sides of the second gate semiconductor layers through the first gate insulation film layers and the second channel layers, being coupled electrically to the first channel layers, and comprising a material the resistance value of which varies in response to a flowing electric current;

a plurality of third channel layers formed cyclically in the Y direction on the −X side of the sides of the second gate semiconductor layers and the third gate semiconductor layers through the first gate insulation film layers and coupled electrically to the first channel layers;

a plurality of second resistance change material layers being formed cyclically in the Y direction on the −X side of the sides of the second gate semiconductor layers through the first gate semiconductor layers and the third channel layers, being coupled electrically to the first channel layers, and comprising a material the resistance value of which varies in response to a flowing electric current; and a plurality of bit lines formed vertically over the respective word lines on the basis of the principal plane of the semiconductor substrate in the manner of extending in the X direction and coupled electrically to the second channels and the third channels, wherein the respective word lines are bundled with other word lines, wherein the respective bit lines are bundled with other bit lines, and wherein two of the bit lines formed vertically over respective bundled two word lines in the word lines are separated electrically.

2. The semiconductor memory device according to claim 1, wherein respective adjacent two word lines of the word lines are bundled together, and wherein respective adjacent two bit lines of the bit lines are bundled together.

3. The semiconductor memory device according to claim 1, wherein respective adjacent two word lines of the word lines are bundled together, wherein odd-numbered bit lines of the bit lines are bundled together, and wherein even-numbered bit lines of the bit lines are bundled together.

4. The semiconductor memory device according to claim 1, wherein respective adjacent three word lines of the word lines are bundled together, wherein 3mth bit lines of the bit lines are bundled together, wherein (3m+1)th bit lines of the bit lines are bundled together, and wherein (3m+2)th bit lines of the bit lines are bundled together.

5. The semiconductor memory device according to claim 1, wherein each of the diode layers extends in the X direction.

6. The semiconductor memory device according to claim 1, wherein each of the diode layers is formed cyclically in the X direction through an insulation film.

7. The semiconductor memory device according to claim 1, wherein a plurality of memory allays each of which includes the word lines, the bit lines, the diode layers, the laminated bodies, the first gate insulation film layers, the first channel layers, the first resistance change material layers, the first transistor layers, and the second transistor layers are laminated to each other, and wherein contacts between the memory arrays are formed at respective parts where the word lines are bundled and respective parts where the bit lines are bundled.

8. A semiconductor memory device comprising:

a plurality of word lines extending in an X direction parallel to a principal plane of a semiconductor substrate;

a plurality of laminated bodies being formed cyclically in the X direction and respectively having first gate semiconductor layers formed over the word lines in the manner of extending in a Y direction intersecting the X direction and being parallel to the principal plane of the semiconductor substrate, a plurality of second gate semiconductor layers formed over the first gate semiconductor layers in the manner of extending in the Y direction and being laminated to each other through insulation layers, and third gate semiconductor layers formed over the second gate semiconductor layers in the manner of extending in the Y direction;

a plurality of first channel layers formed between the first gate semiconductor layers through insulation layers and coupled electrically to the word lines;

a plurality of first gate insulation film layers formed on a +X side and a −X side of the sides of the second gate semiconductor layers and the third gate semiconductor layers;

a plurality of second channel layers formed cyclically in the Y direction on the +X side of the sides of the second gate semiconductor layers and the third gate semiconductor layers through the first gate insulation film layers and coupled electrically to the first channel layers;

first resistance change material layers being formed cyclically in the Y direction on the +X side of the sides of the second gate semiconductor layers through the first gate semiconductor layers and the second channel layers, being coupled electrically to the first channel layers, and comprising a material the resistance value of which varies in response to a flowing electric current;

a plurality of third channel layers formed cyclically in the Y direction on the −X side of the sides of the second gate semiconductor layers and the third gate semiconductor layers through the first gate insulation film layers and coupled electrically to the first channel layers;

second resistance change material layers being formed cyclically in the Y direction on the −X side of the sides of the second gate semiconductor layers through the first gate semiconductor layers and the third channel layers, being coupled electrically to the first channel layers, and comprising a material the resistance value of which varies in response to a flowing electric current; and a plurality of bit lines formed vertically over the respective word lines on the basis of the principal plane of the semiconductor substrate in the manner of extending in the X direction and coupled electrically to the second channels and the third channels, wherein respective adjacent two word lines of the word lines are bundled together, wherein respective adjacent two bit lines of the bit lines are bundled together, and wherein two of the bit lines formed vertically over respective bundled two word lines in the word lines are separated electrically.

9. The semiconductor memory device according to claim 8, wherein the semiconductor memory device further has a driver to apply a drive potential to each of the word lines and the bit lines, wherein N pieces of the laminated bodies are formed in line in the Y direction (N represents an integer satisfying the expression N≥2), and wherein, when a channel coupled to an mth laminated body in the laminated bodies arrayed in the Y direction through the first gate insulation film layers is selected from the second channels or the third channels (m represents an integer satisfying the expression 2≤m≤N−1), (a) in the case of bundling a word line coupled electrically to the mth laminated body with another word line coupled electrically to an (m−1)th laminated body, the driver applies a first potential to each of the word lines coupled to mth and under laminated bodies and each of the bit lines coupled to (m−1)th and under laminated bodies, and applies a second potential different from the first potential to each of the word lines coupled to (m+1)th and over laminated bodies and each of the bit lines coupled to the mth laminated body, and (b) in the case of bundling a word line coupled electrically to the mth laminated body with another word line coupled electrically to an (m+1)th laminated body, the driver applies a third potential to each of the word lines coupled to mth and over laminated bodies and each of the bit lines coupled to (m+1)th and over laminated bodies, and applies a fourth potential different from the third potential to each of the word lines coupled to (m−1)th and under laminated bodies and each of the bit lines coupled to (m−1)th and under laminated bodies.

10. The semiconductor memory device according to claim 9, wherein the driver can switch between first operation using a potential higher than the second potential as the first potential and second operation using a potential lower than the second potential as the first potential, and wherein the driver can switch between third operation using a potential higher than the fourth potential as the third potential and fourth operation using a potential lower than the fourth potential as the third potential.

11. The semiconductor memory device according to claim 8, wherein a plurality of memory allays each of which includes the word lines, the bit lines, the laminated bodies, the first gate insulation film layers, the first channel layers, the first resistance change material layers, the first transistor layers, and the second transistor layers are laminated to each other; and wherein contacts between the memory arrays are formed at respective parts where the word lines are bundled and respective parts where the bit lines are bundled.

12. The semiconductor memory device according to claim 8, wherein the first potential is identical to the third potential, and wherein the second potential is identical to the fourth potential.

13. A semiconductor memory device comprising:

a first plate formed over a semiconductor substrate;

a second plate formed over the first plate;

a plurality of laminated bodies being formed cyclically in an X direction intersecting a Y direction and being parallel to a principal plane of the semiconductor substrate and respectively having first gate semiconductor layers formed over the first plate in the manner of extending in the Y direction parallel to the principal plane of the semiconductor substrate, a plurality of second gate semiconductor layers formed over the first gate semiconductor layers in the manner of extending in the Y direction and being laminated to each other through insulation layers, and third gate semiconductor layers formed over the second gate semiconductor layers in the manner of extending in the Y direction;

a plurality of first channel layers formed between the first gate semiconductor layers through insulation layers;

a plurality of first gate insulation film layers formed on a +X side and a −X side of the sides of the second gate semiconductor layers and the third gate semiconductor layers;

a plurality of second channel layers formed cyclically in the Y direction on the +X side of the sides of the second gate semiconductor layers and the third gate semiconductor layers through the first gate insulation film layers and coupled electrically to the first channel layers and the second plate;

first resistance change material layers being formed cyclically in the Y direction on the +X side of the sides of the second gate semiconductor layers through the first gate semiconductor layers and the second channel layers, being coupled electrically to the first channel layers, and comprising a material the resistance value of which varies in response to a flowing electric current;

a plurality of third channel layers formed cyclically in the Y direction on the −X side of the sides of the second gate semiconductor layers and the third gate semiconductor layers through the first gate insulation film layers and coupled electrically to the first channel layers and the second plate;

second resistance change material layers being formed cyclically in the Y direction on the −X side of the sides of the second gate semiconductor layers through the first gate semiconductor layers and the third channel layers, being coupled electrically to the first channel layers, and comprising a material the resistance value of which varies in response to a flowing electric current;

first transistor layers being formed between the first plate and the first gate semiconductor layers and selecting two first channels adjacent to each other in the Y direction from the first channels; and second transistor layers being formed between the first transistor layers and the first gate semiconductor layers and selecting two first channels adjacent to each other in the Y direction from the first channels.

14. The semiconductor memory device according to claim 13, wherein a plurality of memory allays each of which includes the first plate, the second plate, the laminated bodies, the first gate insulation film layers, the first channel layers, the second channel layers, the third channel layers, the first resistance change material layers, the second resistance change material layers, the first transistor layers, and the second transistor layers are laminated to each other, and wherein contacts between the memory arrays are formed in the first plate and the second plate.

15. The semiconductor memory device according to claim 13, wherein two first channels selected by the first transistor layers and two first channels selected by the second transistor layers in the first channels are different from each other.

* * * * *